(12) United States Patent
Fisher et al.

(10) Patent No.: US 9,490,490 B2
(45) Date of Patent: Nov. 8, 2016

(54) MEASUREMENT DEVICE AND METHOD FOR DETERMINING FUEL CELL STACK SIZE VARIATIONS

(71) Applicant: Bloom Energy Corporation, Sunnyvale, CA (US)

(72) Inventors: John Matthew Fisher, San Jose, CA (US); David Higdon, Sunnyvale, CA (US); Peter Andersen, Sunnyvale, CA (US); Kevin Cheung, Union City, CA (US)

(73) Assignee: BLOOM ENERGY CORPORATION, Sunnyvale, CA (US)

( * ) Notice: Subject to any disclaimer, the term of this patent is extended or adjusted under 35 U.S.C. 154(b) by 622 days.

(21) Appl. No.: 13/905,383

(22) Filed: May 30, 2013

(65) Prior Publication Data
US 2014/0354290 A1 Dec. 4, 2014

(51) Int. Cl.
*H01M 8/04* (2016.01)
*H01M 8/24* (2016.01)
*G01R 31/36* (2006.01)

(52) U.S. Cl.
CPC ......... *H01M 8/04* (2013.01); *H01M 8/04544* (2013.01); *H01M 8/2465* (2013.01); *G01R 31/3627* (2013.01); *Y02E 60/50* (2013.01)

(58) Field of Classification Search
CPC ......... G01R 31/3634; G01R 31/3627; H01M 8/24; H01M 8/04; H01M 8/2465; H01M 8/04544; Y02E 60/50
USPC ......................................................... 324/434
See application file for complete search history.

(56) References Cited

U.S. PATENT DOCUMENTS

| | | | |
|---|---|---|---|
| 2005/0208358 A1* | 9/2005 | Nishimura | H01M 8/04089 429/429 |
| 2007/0108960 A1* | 5/2007 | Chang | H01M 8/04552 324/72 |
| 2007/0154755 A1* | 7/2007 | Wardrop | H01M 8/04552 429/429 |
| 2012/0225366 A1* | 9/2012 | Suto | H01M 8/04671 429/431 |
| 2013/0029245 A1 | 1/2013 | Fisher et al. | |
| 2014/0354290 A1* | 12/2014 | Fisher | H01M 8/04 324/434 |

* cited by examiner

*Primary Examiner* — Yalkew Fantu
*Assistant Examiner* — Manuel Hernandez
(74) *Attorney, Agent, or Firm* — The Marbury Law Group PLLC

(57) ABSTRACT

A measurement device for measuring voltages along a linear array of voltage sources, such as a fuel cell stack, includes at least one movable voltage probe that measures voltage transitions along an array element. The measured voltage is used to determine a distance of travel of the at least one voltage probe along the fuel cell stack from the speed of the probe and the timing of the transitions.

24 Claims, 19 Drawing Sheets

MEASUREMENT DEVICE AND METHOD FOR DETERMINING FUEL CELL STACK SIZE VARIATIONS

BACKGROUND

Electrical power systems are often built from arrays of smaller components such as battery cells, photocells, photovoltaic panels, and fuel cells. For example, fuel cells are often combined into units called "stacks" in which the fuel cells are electrically connected in series and separated by electrically conductive interconnects, such as gas separator plates which function as interconnects.

Fuel cells are typically combined to form a stack in a linear array (configured horizontally or vertically) in which the component fuel cells are electrically connected in series to obtain a preset voltage. A fuel cell stack may contain conductive end plates on its ends. A generalization of a fuel cell stack is the so-called fuel cell segment or column, which may contain one or more fuel cell stacks connected in series (e.g., where the end plate of one stack is connected electrically to an end plate of the next stack). A fuel cell segment or column may contain electrical leads which output the direct current from the segment or column to a power conditioning system. A fuel cell system can include one or more fuel cell columns, each of which may contain one or more fuel cell stacks, such as solid oxide fuel cell stacks.

In the operation of a voltage array, it is often desirable to know the voltage of each component of the array. For example, it may be desirable to know the output voltage of each fuel cell within a fuel cell stack to determine the health of a stack, to provide data for optimization tools, and to determine when maintenance is required. It is also important to minimize impact that the measurement device has on the parameters that it is measuring.

SUMMARY

In an embodiment, a system and method for testing a fuel cell stack are provided where at least one voltage probe is moved along a fuel cell stack. A voltage of fuel cell stack elements is measured sequentially, and at least one dimensional value of the fuel cell stack or the fuel cell stack elements is determined from the sequentially measured voltage measurements.

DETAILED DESCRIPTION

For purposes of this application, a fuel cell stack element "pitch" refers to a repeating distance between the same point on two adjacent fuel cells or interconnects in the stack.

For purposes of this application "sintering" includes processes for heating, melting, and/or reflowing glass or glass-ceramic seal precursor material(s), such as glass or glass-ceramic forming powders and/or glass or glass-ceramic layers in the stack to form the glass or glass-ceramic seals between a fuel cell and two adjacent interconnects in the stack.

"Conditioning" includes processes for reducing a metal oxide (e.g., nickel oxide) in an anode electrode of a solid oxide fuel cell in a stack to a metal (e.g., nickel) in a cermet electrode (e.g., nickel-yttria stabilized zirconia (YSZ) electrode and/or nickel-scandia stabilized zirconia (SSZ) electrode, or Ni-doped ceria (e.g., scandia doped ceria) anode) and/or heating the stack during performance characterization/testing.

A system and method for making contact or non-contact voltage measurement of a semi-continuously-varying (small discrete geometric/electric steps) voltage array of voltage sources is described in pending U.S. application Ser. No. 13/556,794, filed on Jul. 24, 2012, which application claims priority under 35 U.S.C. §119(e) from provisional application No. 61/511,305 filed Jul. 25, 2011. The Ser. No. 13/556,794 application and the 61/511,305 provisional application are incorporated by reference herein, in their entireties, for all purposes.

Figure 1A:
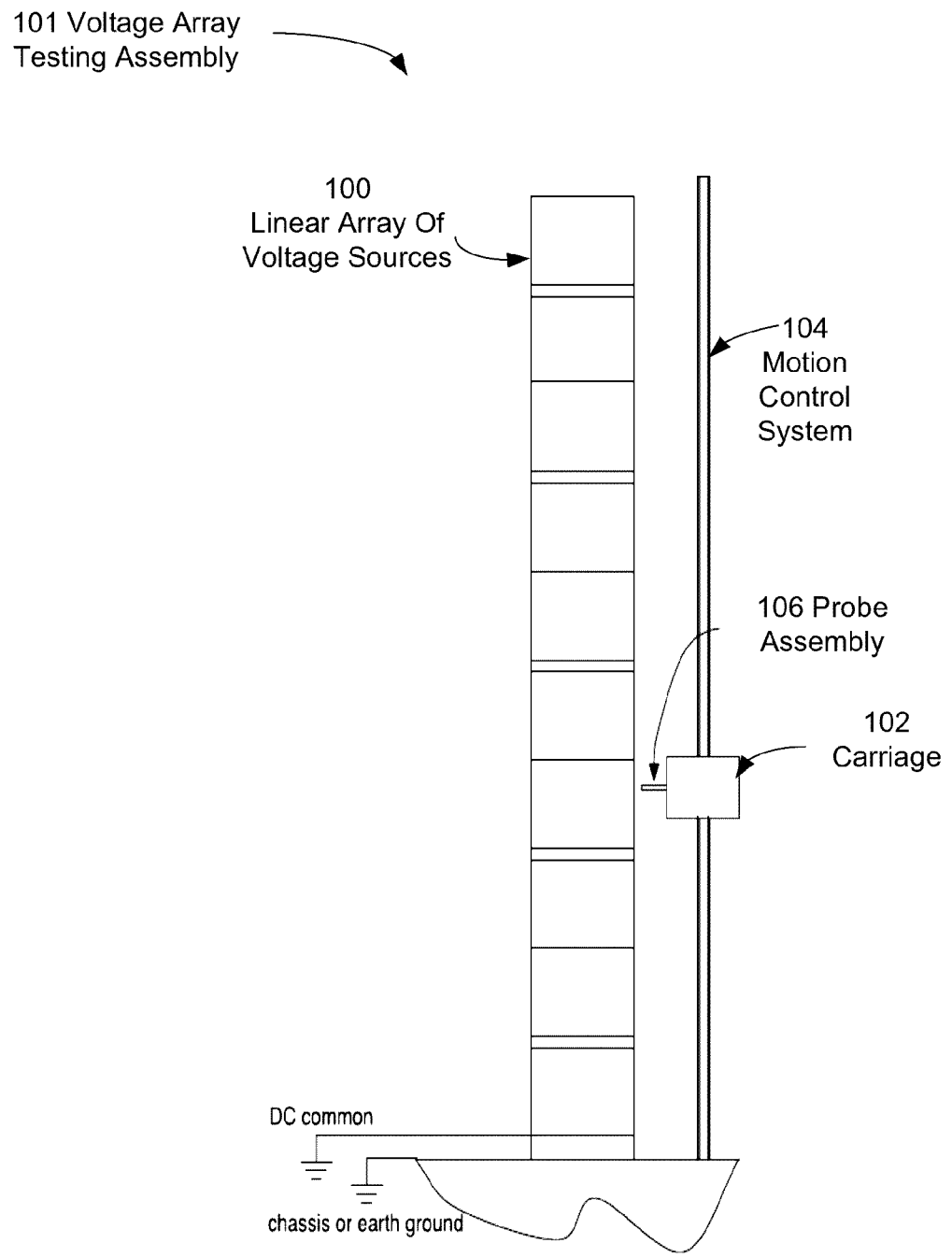
FIG. 1A is a block diagram illustrating a voltage array testing assembly according to an embodiment.

FIG. 1A is a block diagram illustrating a voltage array testing assembly 101 according to an embodiment described in the Ser. No. 13/556,794 application. As illustrated in FIG. 1A, a carriage 102 is moved by a motion control system 104. The movement of the carriage 102 moves probe assembly 106 along a linear array of voltage sources 100. As illustrated in FIG. 1A, the voltage array 100 is oriented vertically and the probe assembly 106 moves vertically under the control of motion control system 104. However, this is not intended to be limiting. In other embodiments, the voltage array 100 may be oriented horizontally or in any direction between vertical and horizontal. The probe assembly 106 would be oriented to move horizontally or in any direction between vertical and horizontal under the control of motion control system 104.

Figure 1B:
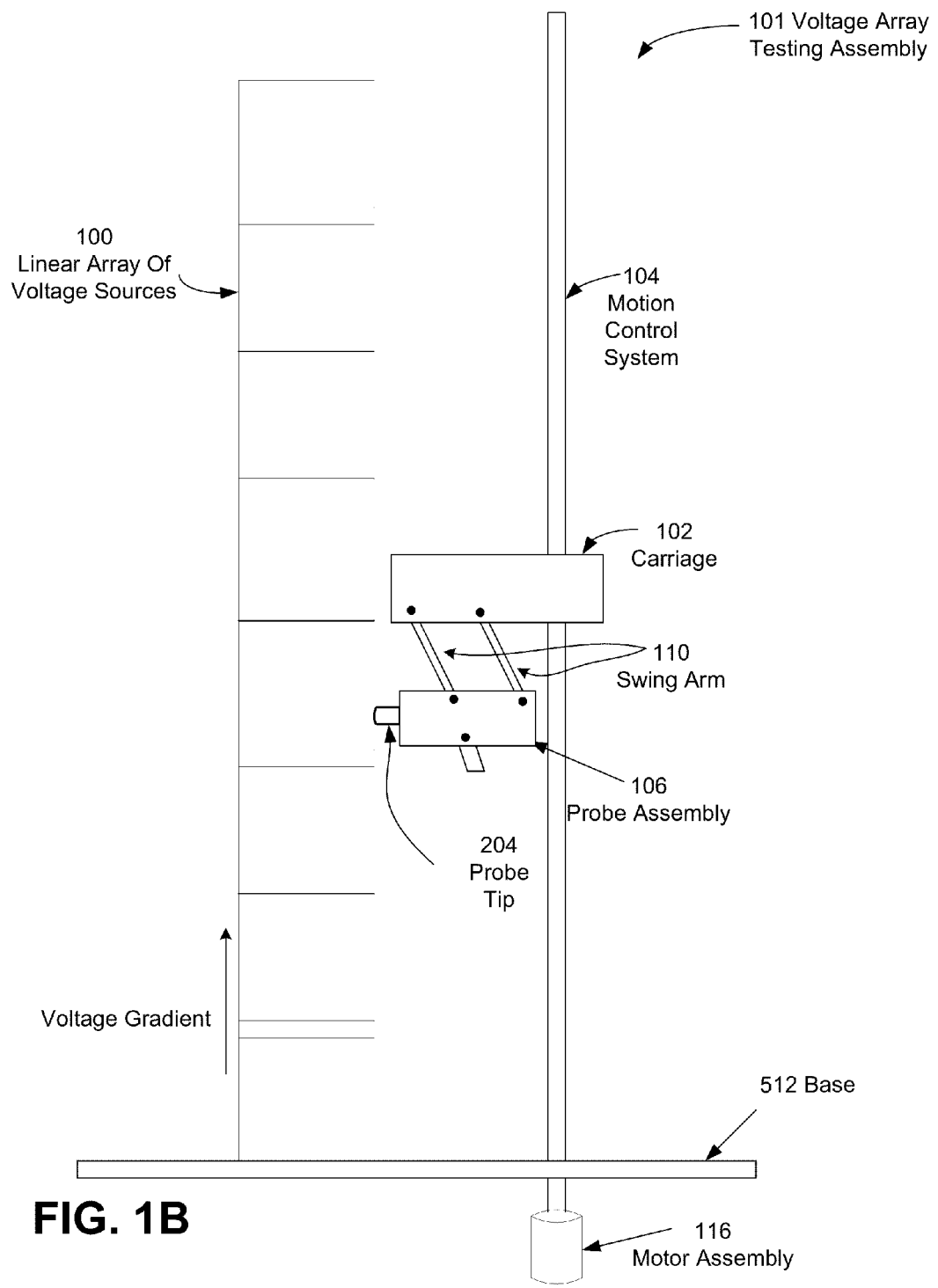
FIG. 1B is a block diagram illustrating a voltage array testing assembly utilizing a contact probe according to an embodiment.

FIG. 1B is a block diagram illustrating a voltage array testing assembly 101 utilizing a contact probe according to an embodiment. An array of voltage sources 100 is contacted by a probe assembly 106 that is moved along the voltage array 100 by a motion control system 104. The probe assembly 106 is suspended from a carriage 102 by swing arms 110. The swing arms 110 are configured such that the probe 204 makes contact with the linear array 100 due to gravitational forces imposed on the probe assembly 106.

The motion control system is driven by a motor assembly 116. The drive motor assembly 116 may be located below base 512, for example under table or other structure that supports the voltage source array 100, or in any other location that permits connection to motion control system 104. As illustrated, the voltage array 100 is oriented vertically and the probe assembly 106 moves vertically under the control of motion control system 104. In other embodiments, the voltage source array 100 may be oriented in any direction between vertical and horizontal and the probe assembly 106 would be oriented to move in any direction between vertical and horizontal under the control of motion control system 104.

Figure 1C:
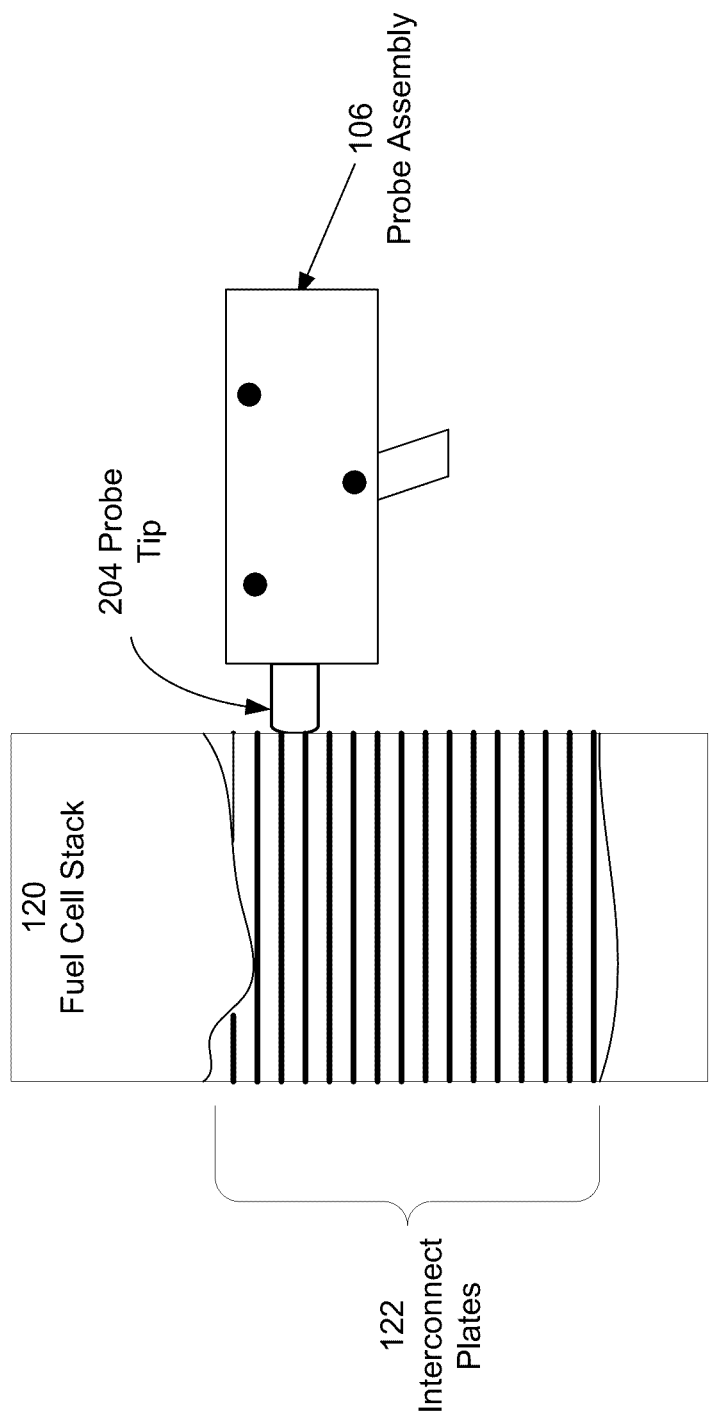
FIG. 1C is a block diagram illustrating a view of a fuel cell array under test utilizing a contact probe according to an embodiment.

FIG. 1C is a block diagram illustrating a view of a fuel cell array under test utilizing a contact probe according to an embodiment.

In an embodiment, the voltage source array 100 may be a fuel cell stack, such as fuel cell stack 120 illustrated in FIG. 1C. Fuel cells are often combined into units called "stacks" in which the fuel cells are electrically connected in series and separated by electrically conductive interconnects, such as gas separator plates which function as interconnects. Thus, adjacent interconnects are separated by a fuel cell and sealant material that is used to seal the fuel cells to the interconnects.

Fuel cells are typically combined to form a stack in a linear array (configured horizontally or vertically) in which the component fuel cells are electrically connected in series to obtain a preset voltage. A fuel cell stack may contain conductive end plates on its ends. The fuel cell stack 120 uses interconnects 122 to connect fuel cells (not shown for clarity) in series. Voltage measurements may be made at each of the interconnects to determine the voltage of each cell within the stack 120.

In an embodiment, the probe tip 204 may be constructed from an electrically conductive ceramic material, such as a spinel ceramic material, that has a resistivity that is high enough to prevent shorting of adjacent interconnects 122 if two interconnects are contacted at the same time by one probe tip 204 while low enough to measure the voltage of each of the fuel cells that make up the fuel cell stack 120. For example, the probe tip 204 may have a resistivity of about 0.1 to 3 $\Omega$-cm. In another embodiment, the probe is configured to accept shorting of the adjacent elements and to limit the shorting current from about 1 mA to about 100 mA.

For example, a probe material with resistivity in the range of 0.1 $\Omega$-cm and 3 $\Omega$-cm at 850° C. would serve this purpose. Other ceramic materials would also provide this functionality, such as CMCs described below containing electrically conductive fibers in an insulating matrix.

In another embodiment, the contacting probe uses oxide composite materials (e.g., ceramic composite materials) in combination with a voltage sensing wire to perform cell voltage testing at elevated temperatures. The CMC may include, for example, a matrix of aluminum oxide (e.g., alumina), zirconium oxide or silicon carbide. Other matrix materials may be selected as well. The CMC may include ceramic or other electrically insulating fibers in the matrix. The fibers may be made from alumina, carbon, silicon carbide, or any other suitable material. Any combination of the matrix and fibers may be used. Additionally, the fibers may be coated with an interfacial layer designed to improve the fatigue properties of the CMC. In an embodiment, the CMC forms a sheath or shell around the voltage sensing wire, which may be made of any suitable electrically conductive material, such as platinum, copper, etc. In an embodiment, the wire is exposed at the tip of the probe and used to test linear arrays where shorting of adjacent elements of the linear array is not a concern.

Figure 2:
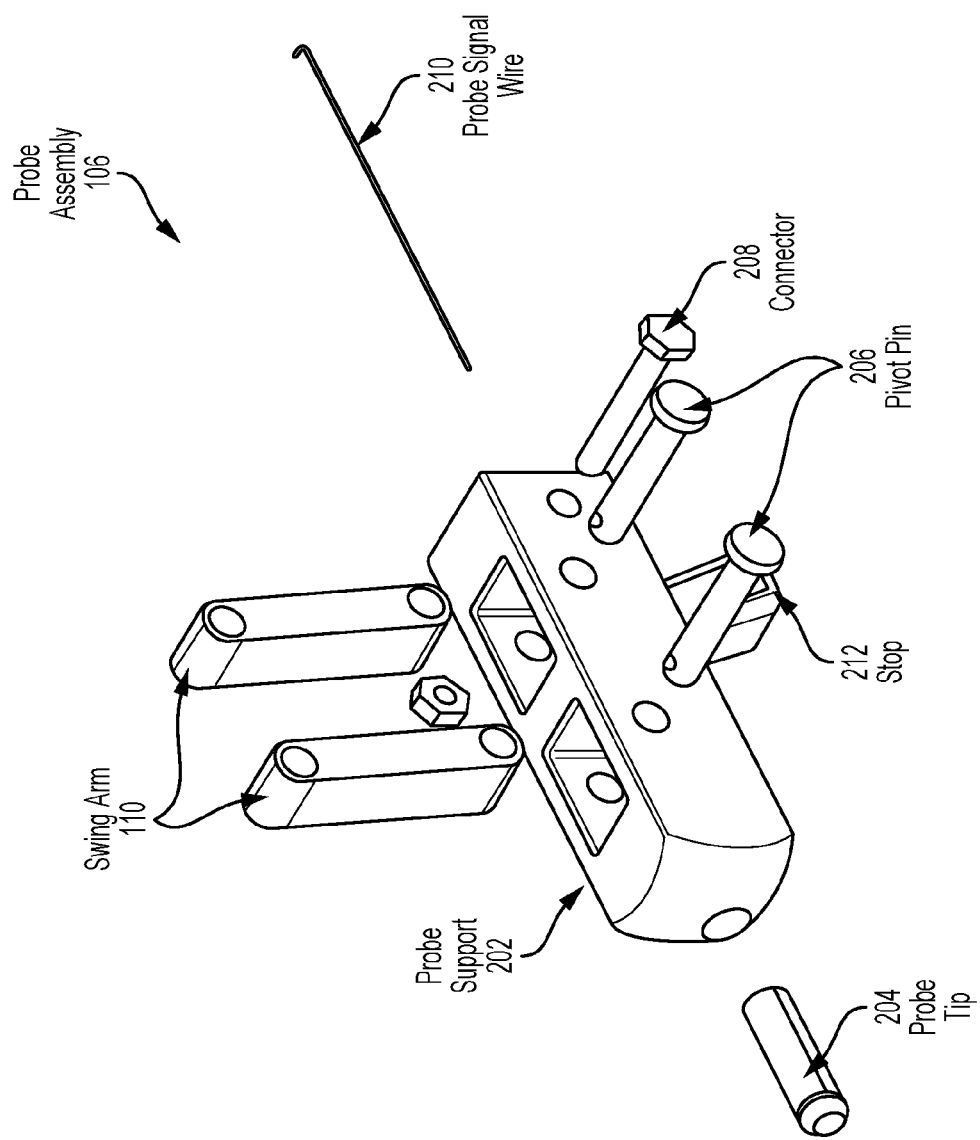
FIG. 2 is a perspective view illustrating components of a sensing probe assembly of FIG. 1B according to an embodiment.

FIG. 2. is a block diagram illustrating components of a sensing probe assembly according to an embodiment.

In an embodiment illustrated in FIG. 2, the probe assembly 106 comprises a probe support 202, a probe tip 204, pivot pins 206, swing arms 110, a signal conductor 210, a signal connector 208 and a stop 212. The probe support 202 provides a housing into which a probe tip 204, pivot pins 206, swing arms 110, a signal conductor 210, a signal connector 208 and optionally a stop 212 are inserted into holes in the housing. Alternatively, stop 212 may be integrated with probe support 202. Swing arms 110 move freely on pivot pins 206 or other connection devices. The swing arms 110 also connect to the carriage 102 (see, FIGS. 1B and 5C) using the pivot pins 206 or other connection devices that allow the probe support 202 to swing freely below the carriage 102. Preferably, the respective pivot pins on the carriage 202 (which support the upper ends of the swing arms 110) are positioned closer to the array of voltage sources 100 than the respective pivot pins 206 on the probe support, such that the lower ends of swing arms 110 (connected to the pivot pins 206 on probe support 202) slope away from the array of voltage sources 100 when the probe tip 204 contacts the array 100. The diagonal positioning of the swing arms 110, with the upper arm ends being closer to the array 100 than the respective lower arm 110 ends, allows gravity to pull the probe tip 204 toward the array of voltage sources 100, as shown in FIG. 1B. The probe tip 204 thus swings to/from the voltage source array 100 so as to contact each source in the voltage array 100 as the carriage 102 moves along the array. The probe tip 204 makes contact with the linear array 100 due to gravitational forces imposed on the probe assembly 106.

Figure 3:
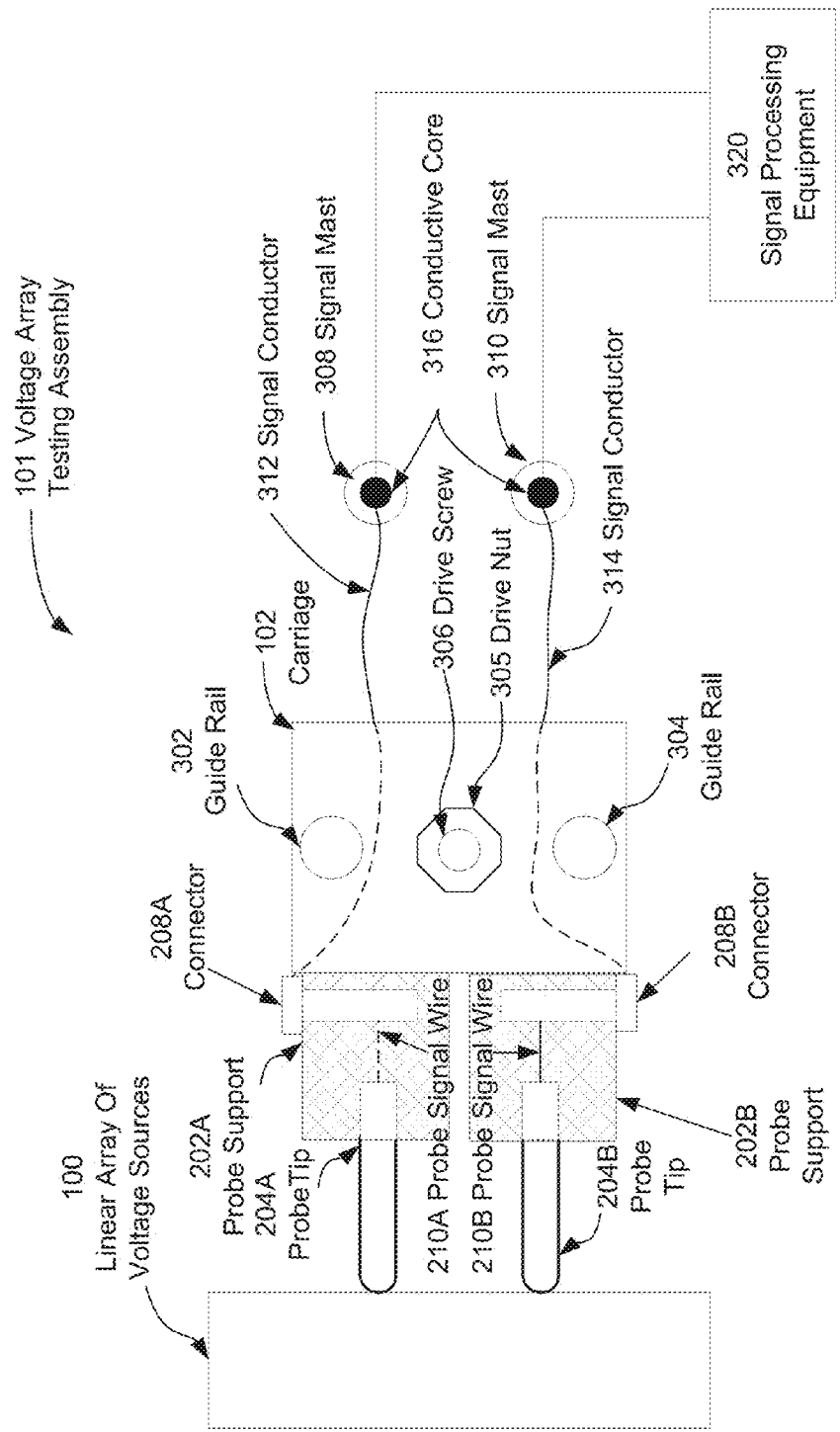
FIG. 3 is a block diagram illustrating a top view of a contact sensing probe assembly of FIG. 1B according to an embodiment.

The probe signal wire 210 connects the probe tip 204 to the connector 208. The connector 208 joins a signal conductor (312 and 314 in FIGS. 3 and 5B) to a signal mast (FIG. 3 and FIG. 5B, 308). The probe signal wire may be a platinum wire or other conductor, for example, a platinum wire having a diameter of 0.5 mm. In an embodiment, the signal conductor 312 may be a conductive flexible chain.

A stop 212 limits the movement of the carriage/probe assembly at the lower limit of the motion control system 104. The stop 212 may be a rod or a bar that is attached to or integrated with the bottom of the probe support 202 and acts as a door stop when probe support 202 is lowered to the base support.

In an embodiment, the probe support 202 is formed from a ceramic matrix composite (CMC). The CMC may include, for example, a matrix of aluminum oxide (e.g., alumina), zirconium oxide or silicon carbide. Other matrix materials may be selected as well. The CMC may include ceramic or other electrically insulating fibers in the matrix. The fibers may be made from alumina, carbon, silicon carbide, or any other suitable material. Any combination of the matrix and fibers may be used. Additionally, the fibers may be coated with an interfacial layer designed to improve the fatigue properties of the CMC.

FIG. 3 is a block diagram illustrating a top view of a contact sensing probe assembly of FIG. 1B according to an embodiment.

The carriage 102 is propelled (vertically or horizontally) by the motion control system 104. In an embodiment, the motion control system includes a threaded drive screw 306 that rotates within a drive nut 305 affixed to the carriage 102. The carriage 102 is guided by guide rails 302 and 304, which extend through openings in the carriage 102.

In an embodiment, the drive nut 305 may be a metallic nut assembly, or a ceramic one, which may be metalized on its interior surface. The drive nut 305 may include a low-friction coating applied to reduce the required drive torque to move the carriage assembly up and down the drive screw 306. The drive screw 306 may be of the acme type, or a similar thread profile intended for linear drive purposes. The drive screw 306 may be metallic, which is less expensive, or ceramic, which has advantages such as material creep properties, oxidation properties, tribology and thermal expansion.

The drive screw 306 may be coupled to a permanent magnet motor assembly, a gear-motor, or similar system 116 (shown in FIG. 1B).

In an embodiment, the probe assembly 106 is configured with two probe tips 204A and 204B, supported in respective probe supports 202A and 202B, which may be configured with horizontal offset to provide differential voltage readings simultaneously between two or more portions of one voltage array element (for example, a single interconnect of a fuel cell). For example, in the case where the linear array is a fuel cell stack, the two probe tips 204A and 204B may be configured to contact two portions of an edge of one interconnect simultaneously to allow for direct measurement of the difference in voltage between the left and right portions of an interconnect in the fuel cell stack under test.

In another embodiment, the two probe tips 204A and 204B may be configured side-by-side with a specific vertical offset between them to allow a differential voltage measurement between two adjacent elements in the voltage array (for example, two adjacent interconnects). As previously noted, "adjacent" includes interconnects that are separated by a fuel cell and the seals between the fuel cell and the interconnect plate. Measurements may also be taken with one probe or more than two probes, such as three or more probes.

In an embodiment, the differential voltage (i.e., difference in measured voltages) between adjacent elements of a voltage source array (for example, two adjacent interconnects) may also be acquired by a single probe tip 204. In this embodiment, the carriage 202 is moved to a position to permit the probe tip 204 to measure a first voltage of a first interconnect. In other words, the probe tip 204 contacts the edge of the first interconnect. The carriage is then moved up or down to position the probe tip 204 to measure a second voltage of second interconnect that is adjacent to the first interconnect. In other words, the probe tip 204 contacts the edge of the second interconnect in the stack. The difference between the first and second measured voltages is then determined to arrive at the differential voltage between the first and the second interconnects. Measurements may also be taken with more than one probe, such as two or more probes.

Signals from the probe tip 204A are provided to connector 208A by a probe signal wire 210A. Signals from the probe tip 204B are provided to connector 208B by a probe signal wire 210B. A signal conductor 312 connects signal mast 308 to connector 208A, and a signal conductor 314 connects signal mast 310 to connector 208B. In an embodiment, the signal conductors 312 and 314 are conductive chains that flex with the movement of the carriage 102. (See, FIGS. 5B and 5D.) The conductive chains may be weighted to direct the chains away from the path of the carriage 102 when the carriage 102 is in motion.

The signal masts 308 and 310 may be constructed of a ceramic shell enclosing a conductive core 316 that connects to the signal conductors 312 and 314 and provides signals to signal processing equipment 320. If desired, the conductive chains may be connected directly to the probe tips 204A and 204B.

Figure 5A:
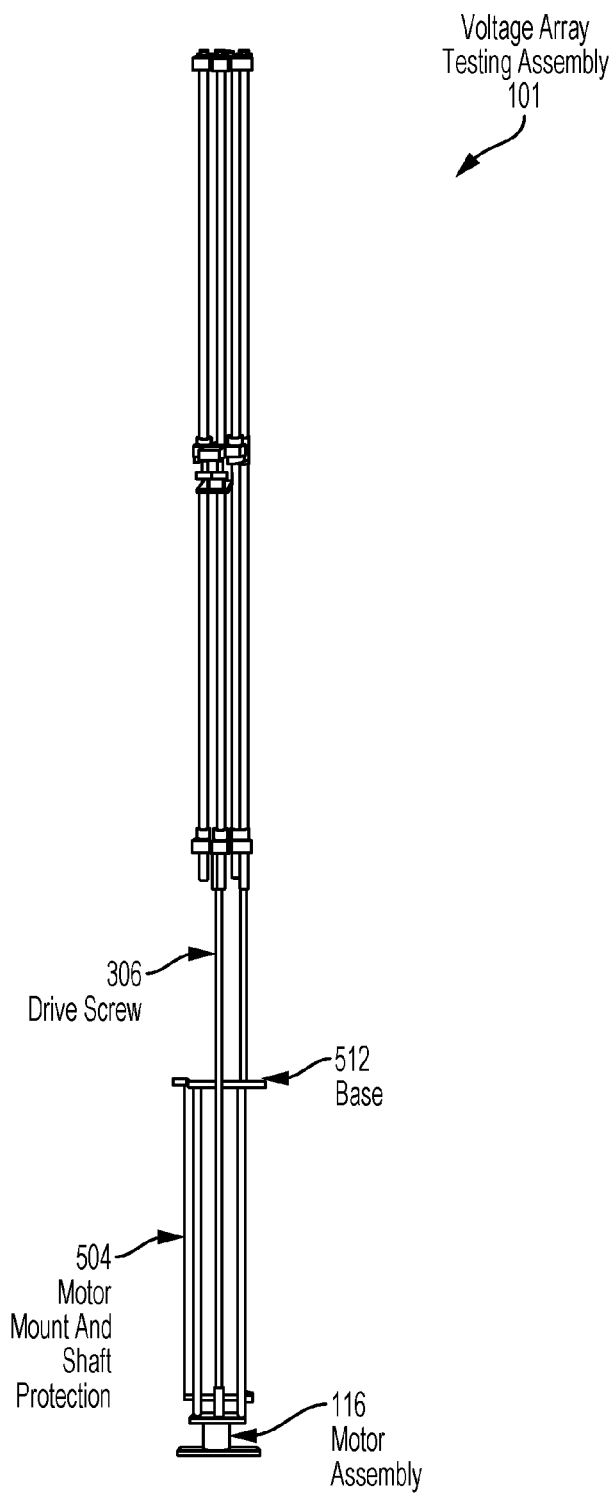
FIG. 5A is an exploded perspective view illustrating components of a voltage array testing assembly of FIG. 1B according to an embodiment.
Figure 5B:
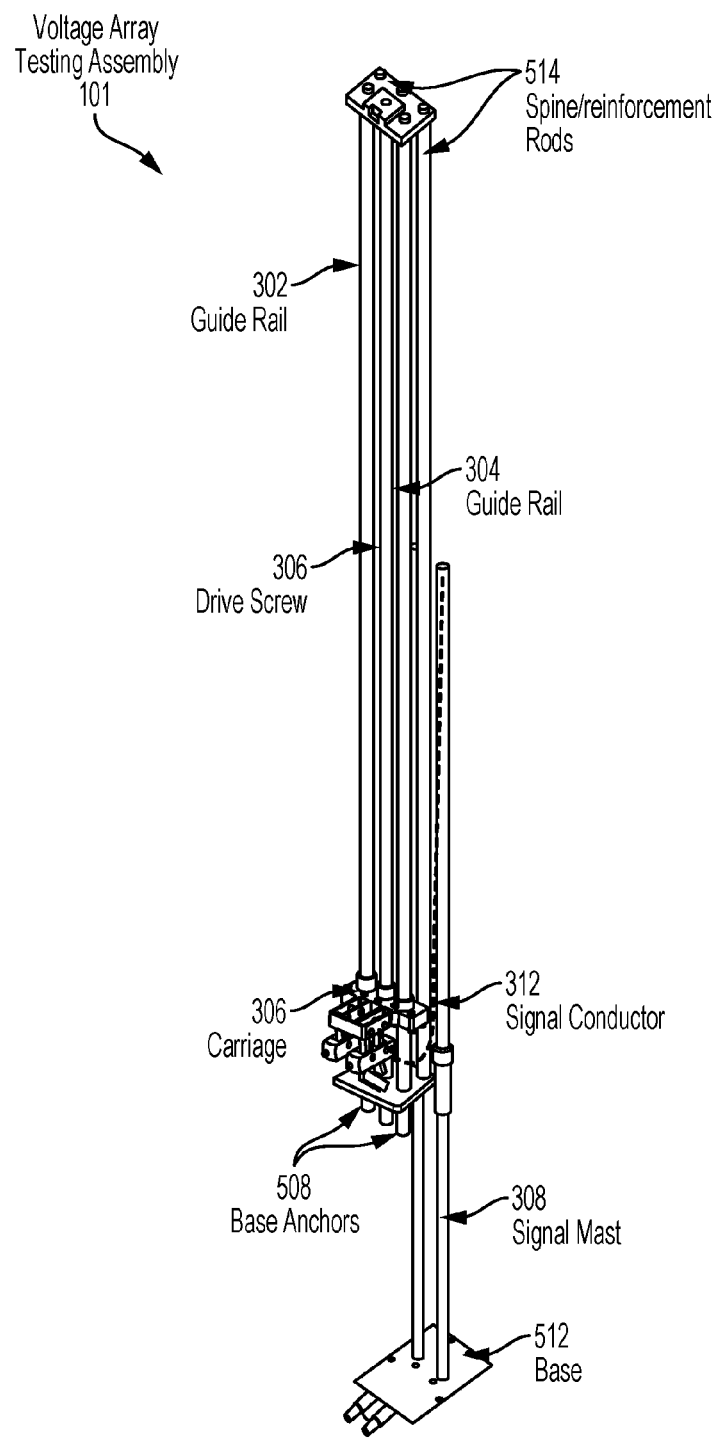
FIG. 5B is an exploded perspective view further illustrating components of a voltage array testing assembly of FIG. 1B according to an embodiment.

FIGS. 5A-5E illustrate components of the voltage source array testing assembly 101. As illustrated in FIG. 5A, the drive screw 306 connects to the motor assembly 116 through a motor mount and shaft protection assembly 504. The motor mount and shaft protection assembly 504 may be located below base 512, for example under table or other structure that supports voltage array 100, or in any other location that permits connection to motion control system 104.

As illustrated in FIG. 5B, the guide rails 302 and 304 are positioned on either side of the drive screw 306. The carriage 102 is propelled by the drive screw 306 and moves along the guide rails 302 and 304. Base anchors 508 are secured to a base 512 during operation of the voltage source array testing assembly 101 (FIG. 5B shows the exploded view for clarity). In addition, the voltage source array testing assembly 101 is stabilized by one or more (for example, two) spine/reinforcement rods 514. The spine reinforcement rods 514 may be constructed of a ceramic. The base 512 also provides support for the fuel cell stack. FIG. 5B also illustrates a signal conductor 312 (signal conductor 314, while present, is not illustrated in FIG. 5B; see also FIG. 3) connected to a signal mast 308. In an embodiment, the signal conductors 312 and 314 are formed from flexible conductive chains.

Figure 5C:
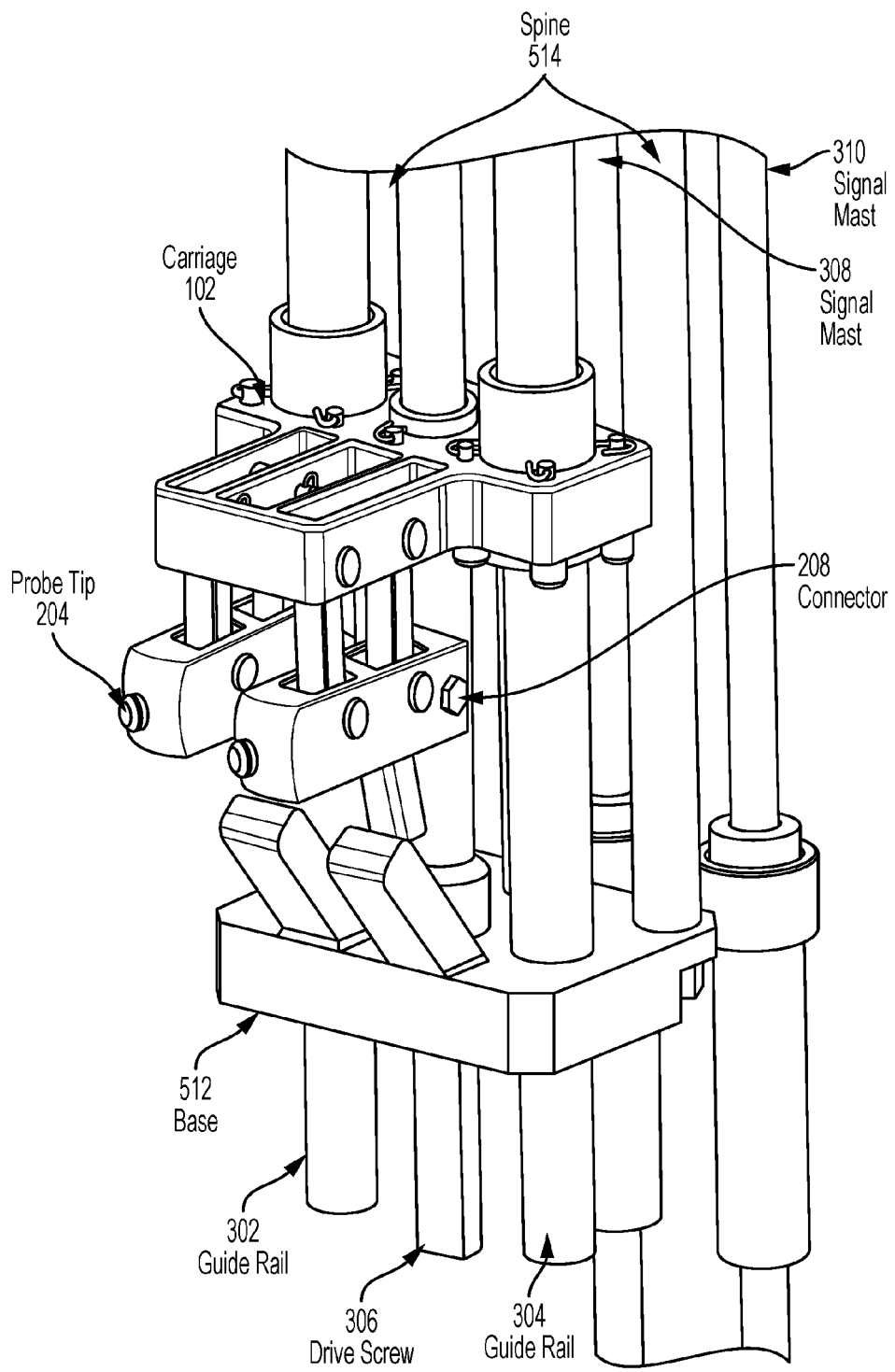
FIG. 5C is a perspective view illustrating a view of selected components of a voltage array testing assembly of FIG. 1B according to an embodiment.

FIG. 5C further illustrates various components of the voltage array testing assembly 101. The guide rails 302 and 304 are positioned on either side of the drive screw 306. The drive screw 306 penetrates the base 512 to connect to the motor assembly 116. The spine/reinforcing rods 514 and the guide rails 302 and 304 may also penetrate the base or be attached to the base 512.

Figure 5D:
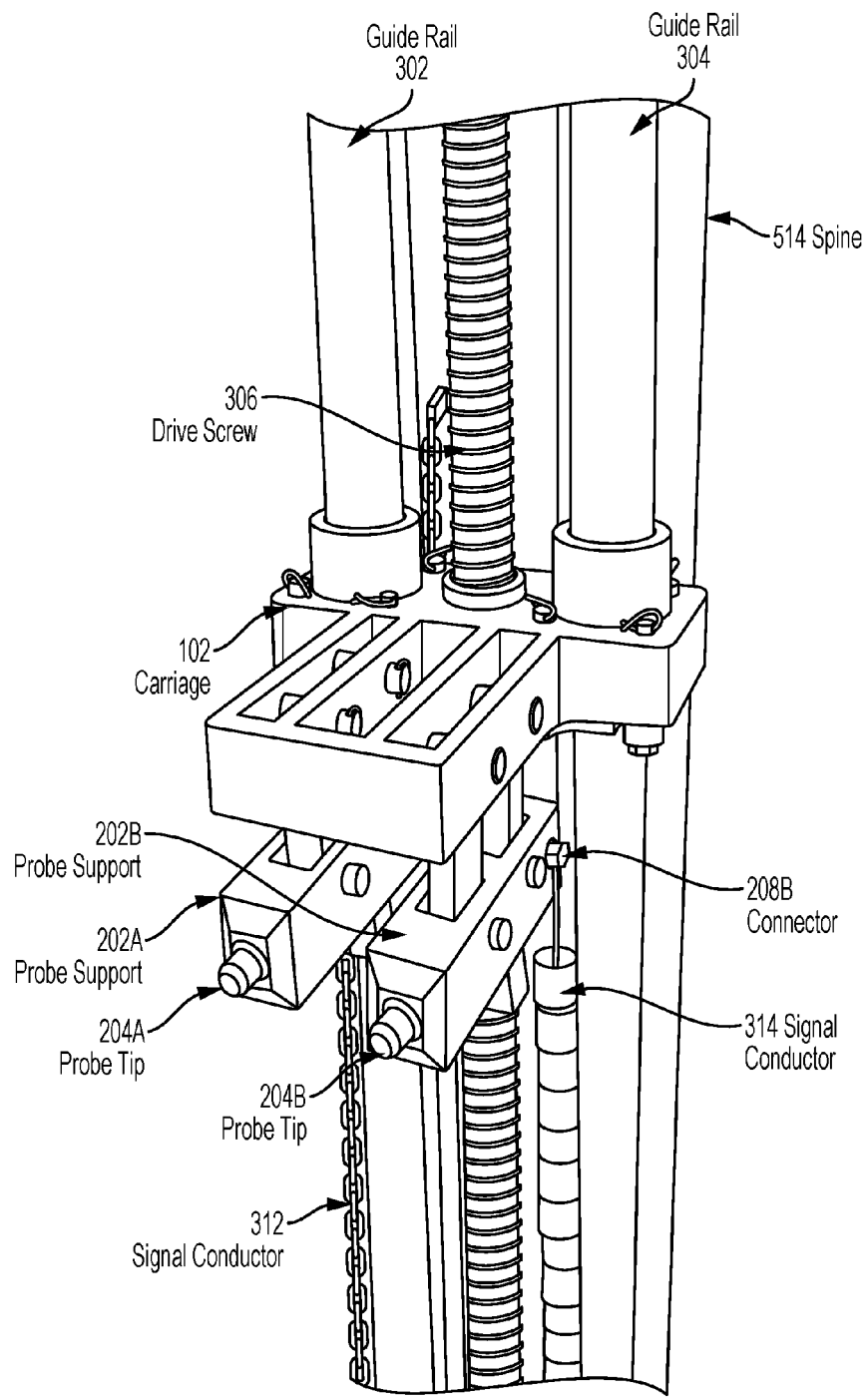
FIG. 5D is a photograph of selected components of an exemplary voltage array testing assembly of FIG. 1B according to an embodiment.

FIG. 5D further illustrates various components of the voltage source array testing assembly 101. The guide rails 302 and 304 are positioned on either side of the drive screw 306 and penetrate the carriage 102. Probe support 202A with probe tip 204A and probe support 202B with probe tip 204B are shown suspended from the carriage 102. Both signal conductors 312 and 314 and one spine 514 are visible. The connection of signal conductor 314 to connector 208B is also visible.

Figure 5E:
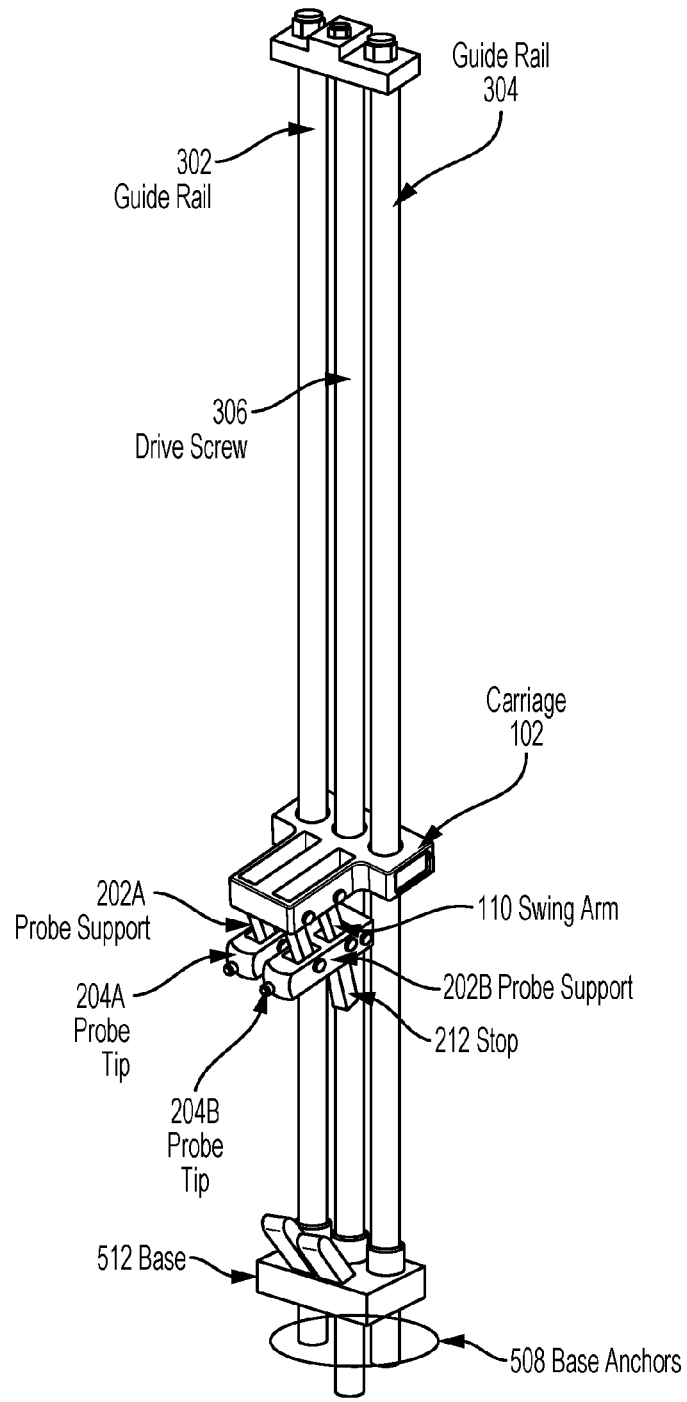
FIG. 5E is a non-exploded perspective view further illustrating components of a voltage array testing assembly of FIG. 1B according to an embodiment.

FIG. 5E is a non-exploded view further illustrating components of a voltage array testing assembly of FIG. 1B according to an embodiment. The guide rails 302 and 304 are positioned on either side of the drive screw 306 and penetrate the carriage 102. Probe support 202A with probe tip 204A and probe support 202B with probe tip 204B are shown suspended from the carriage 102 via swing arms 110. The swing arms 110 move freely on pivot pins, thereby allowing the probe supports 202A and 202B to swing freely below the carriage 102. The probe tips 204A and 204B make contact with the linear voltage array 100 (for example, a fuel cell stack) due to gravitational forces. A base 512 and base anchors 508 are also shown.

Figure 6:
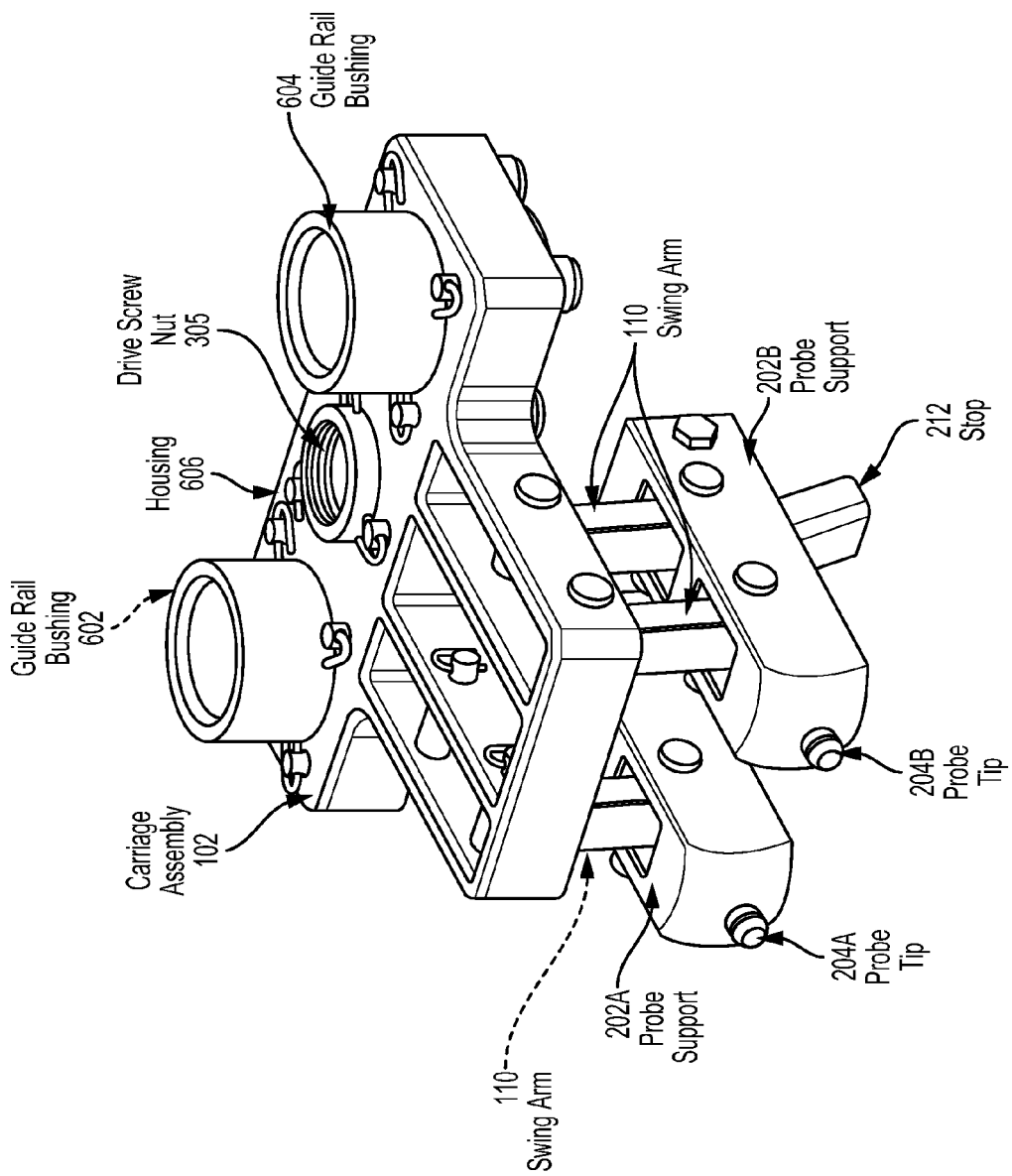
FIG. 6 is a block diagram illustrating a view of a carriage/probe assembly according to an embodiment.

FIG. 6 illustrates a carriage/probe assembly according to an embodiment. The carriage 102 is constructed from discrete components that include a drive screw nut 305 and two guide rail bushings 602 and 604. The drive screw nut 305 and the guide rail bushings 602 and 604 are fastened to the carriage 102 housing 606 by screws or other fasteners. As previously described, the carriage 102 is propelled by a drive screw 305 (see, for example, FIG. 5A) and is guided by guide rails that are passed through the guide rail bushings 602 and 604.

A probe support 202A holds a probe tip 204A. A probe support 202B holds a probe tip 204B. The probe supports 202A and 202B are suspended from the carriage 102 housing 606 by swing arms 110. The swing arms 110 move freely on pivot pins, thereby allowing the probe supports 202A and 202B to swing freely below the carriage 102. The probe tips 204A and 204B make contact with the linear voltage array 100 (for example, a fuel cell stack) due to gravitational forces.

Figure 7:
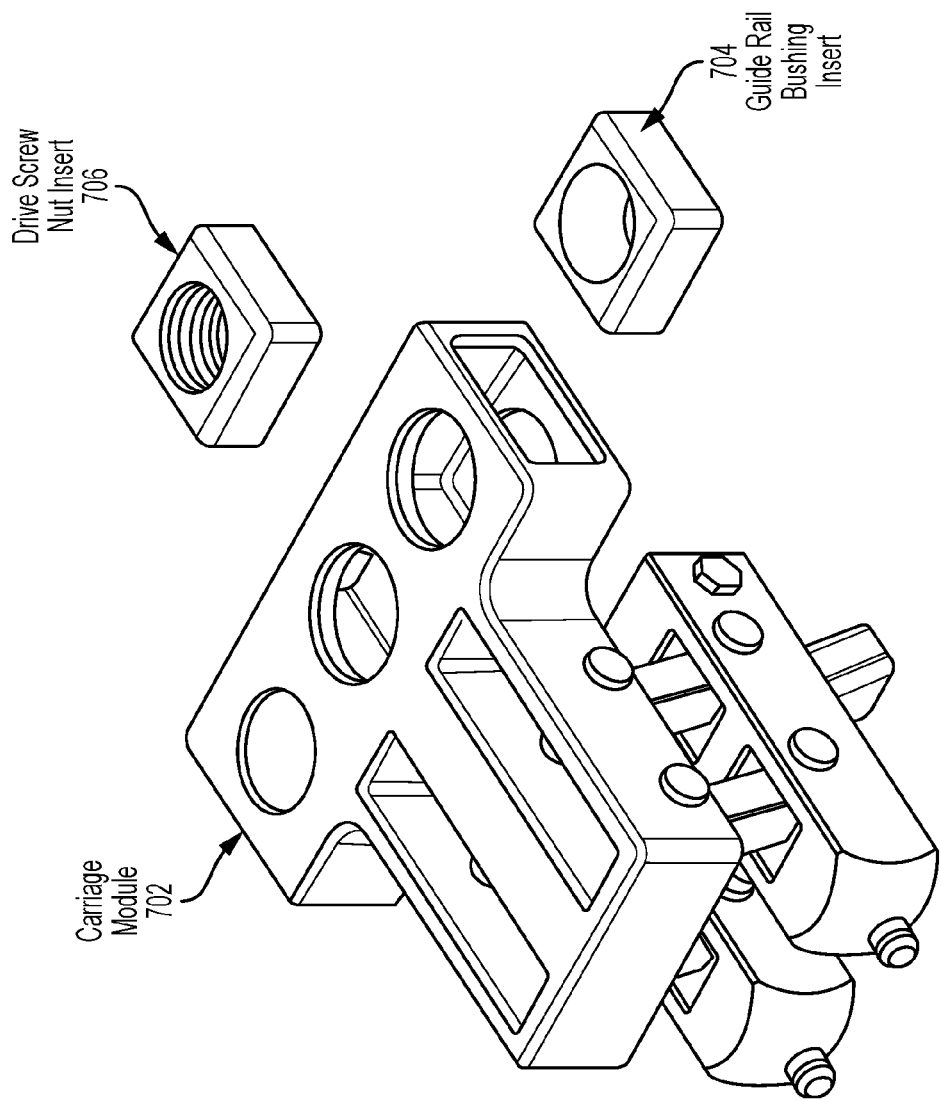
FIG. 7 is a block diagram illustrating a view of a modular carriage/probe assembly according to an embodiment.

FIG. 7 illustrates a modular carriage assembly. In this embodiment, a carriage module 702 (e.g., a housing) is constructed to receive a guide rail bushing insert 704 and a drive nut insert 706. The inserts do not require fasteners as in the case of the carriage 102 shown in FIG. 6.

In operation of the voltage source array testing assembly 101, a probe position is initially calibrated to the ends of the voltage source array under test. The carriage holding one or more probes moves from one end of the array to the other and then reverses direction. The carriage moves at a sufficient rate of linear speed to meet the competing requirements of quick cycle time and accurate measurement of each discrete element (for example, an interconnect in fuel cell stack) in the voltage source array. The signal masts obtain signal data from the voltage source array. The signal data are received by the signal processing equipment 320 and processed to determine the absolute voltage of each point in the array as well as the differential voltage between points in the same element or in adjacent elements.

In an embodiment, the probe is flexibly supported so as to apply a compression load to the fuel cell stack components, such as interconnects, under test.

Figure 4:
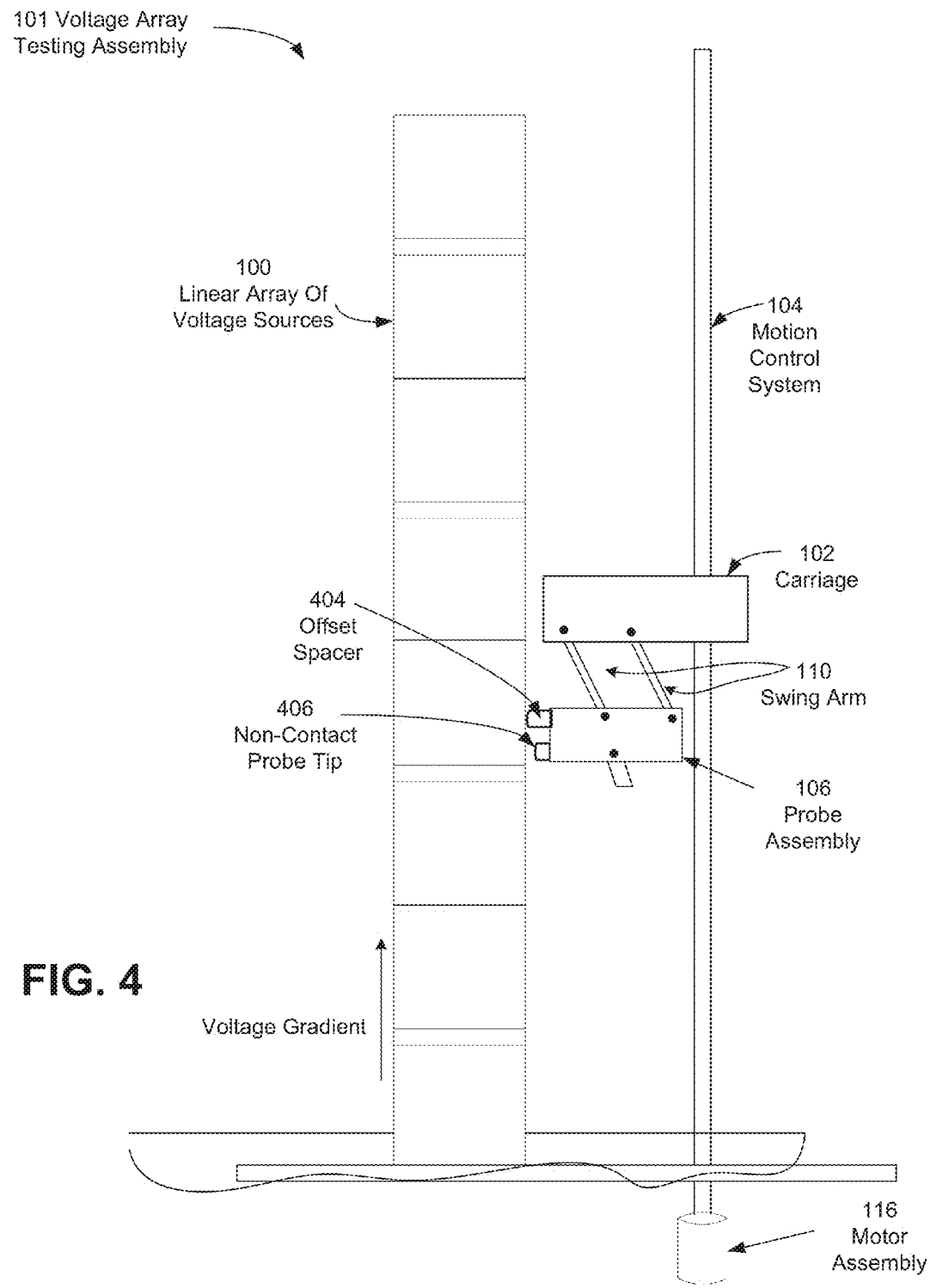
FIG. 4 is a block diagram illustrating a view of a voltage array testing assembly utilizing a non-contact probe according to an embodiment.

FIG. 4 is a block diagram illustrating a view of a voltage array testing assembly utilizing a non-contact probe according to an alternate embodiment. In this embodiment, a sensing probe 406 does not contact the voltage array 100 under test. Rather, the probe is configured to interact with a cyclic electromagnetic field radiated by the voltage array 100. The array 100 and the air gap between the probe 406 and the voltage array 100 form a weak capacitor. The probe may be formed from electrically conductive material, metal or otherwise. In an embodiment, the probe is maintained at a nearly constant displacement from the fuel cell voltage array by a non-conducting offset spacer 404 located on the edge of the probe support 202.

In still another embodiment, the probe 406 may be formed from an electronically sensitive semiconductor junction. In this embodiment, the semiconductor junction forms a sensitive capacitor at the tip of the probe 406. For example, the probe 406 may be made of a high temperature tolerant semiconductor material, such as silicon carbide. Adjacent portions of the silicon carbide rod may be doped with p and n type dopants to form a p-n or p-i-n junction to enhance sensitivity. In this embodiment, a much stronger signal is generated, inherently with higher signal/noise ratio (SNR hereafter) that is resistant to EMI from the environment. Because of the stronger signal, the instrumentation electronics circuitry may be simplified making it less expensive and more reliable.

The normal mode of excitation of the capacitor is for a static negative charge to form on the tip of probe 406. Using a fuel cell stack as an example, the charge accumulates to a static level proportional to the effective capacitance of the capacitor formed by the parallel plate arrangement of the narrow fuel cell interconnect at Voltage 1 (V1) and the probe at Voltage 2 (V2). In steady-state conditions, a conducting path connected from the probe sensing rod, V2, to ground would carry no electrical current. By imposing an additional sinusoidal current on the fuel cell array, the voltage of the fuel cell array oscillates about a mean value sinusoidally. A similar oscillating signal is transmitted through the capacitor formed by the fuel cell interconnect and the probe 406. The oscillating current to ground can be detected by instrumentation. This current will be proportional to the strength of the electric field driving the capacitor and the voltage creating the electric field. The higher the effective capacitance of the capacitor, the stronger this oscillating current signal will be, thereby simplifying the back-end electronics used to detect the signal and interpret the results.

Thus, the device may measure voltage difference across small geometric regions (cells) along a linear array of mechanically coupled voltage sources (e.g., fuel cell stack) without requiring physical contact of the probe 406 and the voltage source array 100.

In another embodiment, a "deck of cards" type or thin sheet type of contact or non-contact probe may be used. The probe may be made of an electrically conductive ceramic or ceramic composite material. Alternatively, the probe may be made of an electrically insulating ceramic sheet or "deck" with plated conductive traces on its surface(s) or conductive wires embedded in its volume and exposed on the tip. The probe may be thinner than the electrolyte of the SOFCs in the stack. This allows the probe to be inserted into a recess near the edge of the electrolyte between the adjacent interconnects in the stack to contact both adjacent interconnects.

In an embodiment, the physical properties of the drive mechanism and the detection of a voltage transition between cells are used to extract dimensional data from a voltage array under test. As illustrated in FIG. 5A, a drive screw 306 connects to a motor assembly 116. The rotational speed of the motor of motor assembly 116 is controlled by an encoder (not illustrated). The drive screw 306 has a known thread pitch. The pitch of the drive screw 306 is precisely matched to the thread pitch of the drive screw nut 305 (FIG. 6). The rotational motion of the drive screw 306 is translated by the drive screw nut 305 to a vertical motion of the carriage 102 (FIG. 5C) and the probes 202A and 202B connected to it. The shaft rotational speed and the drive screw thread pitch may be used to accurately determine a speed of travel of the probes 202A and 202B. By way of illustration and not by way of limitation, the drive train properties and a voltage transition may be used to measure a fuel cell stack element pitch, a variation in cell height and/or to determine the shrinkage or setting of seals before and after stack sintering, before and after conditioning and between sintering and conditioning. The embodiments described below utilize a dimensional array testing assembly in which contact probes are used to measure a differential voltage in an array under test. However, this is not meant as a limitation. In another embodiment, the probes are non-contact probes as described herein.

Figure 8:
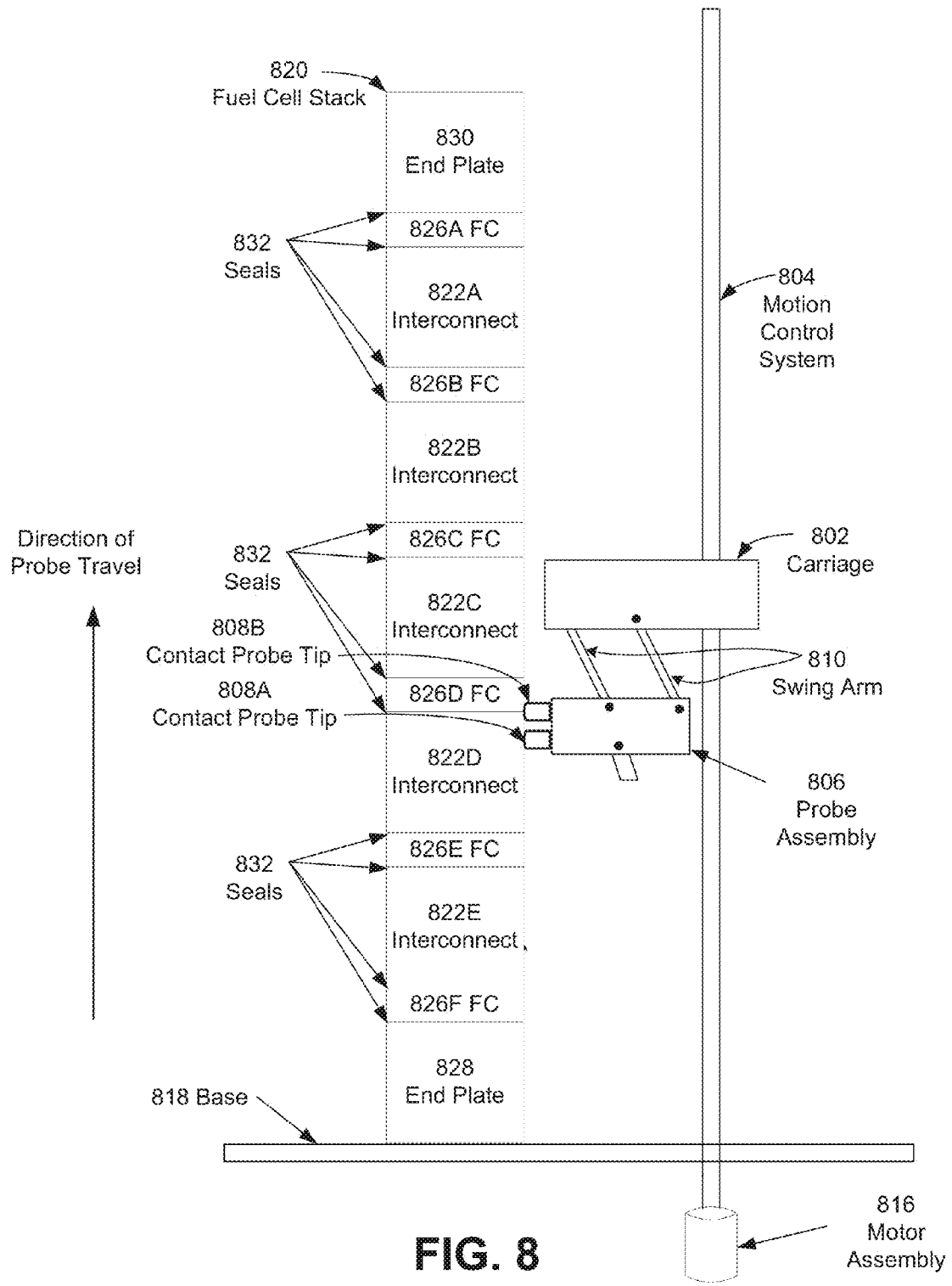
FIG. 8 is a block diagram illustrating a view of a dimensional array testing assembly utilizing at least two probes according to an embodiment.
Figure 9:
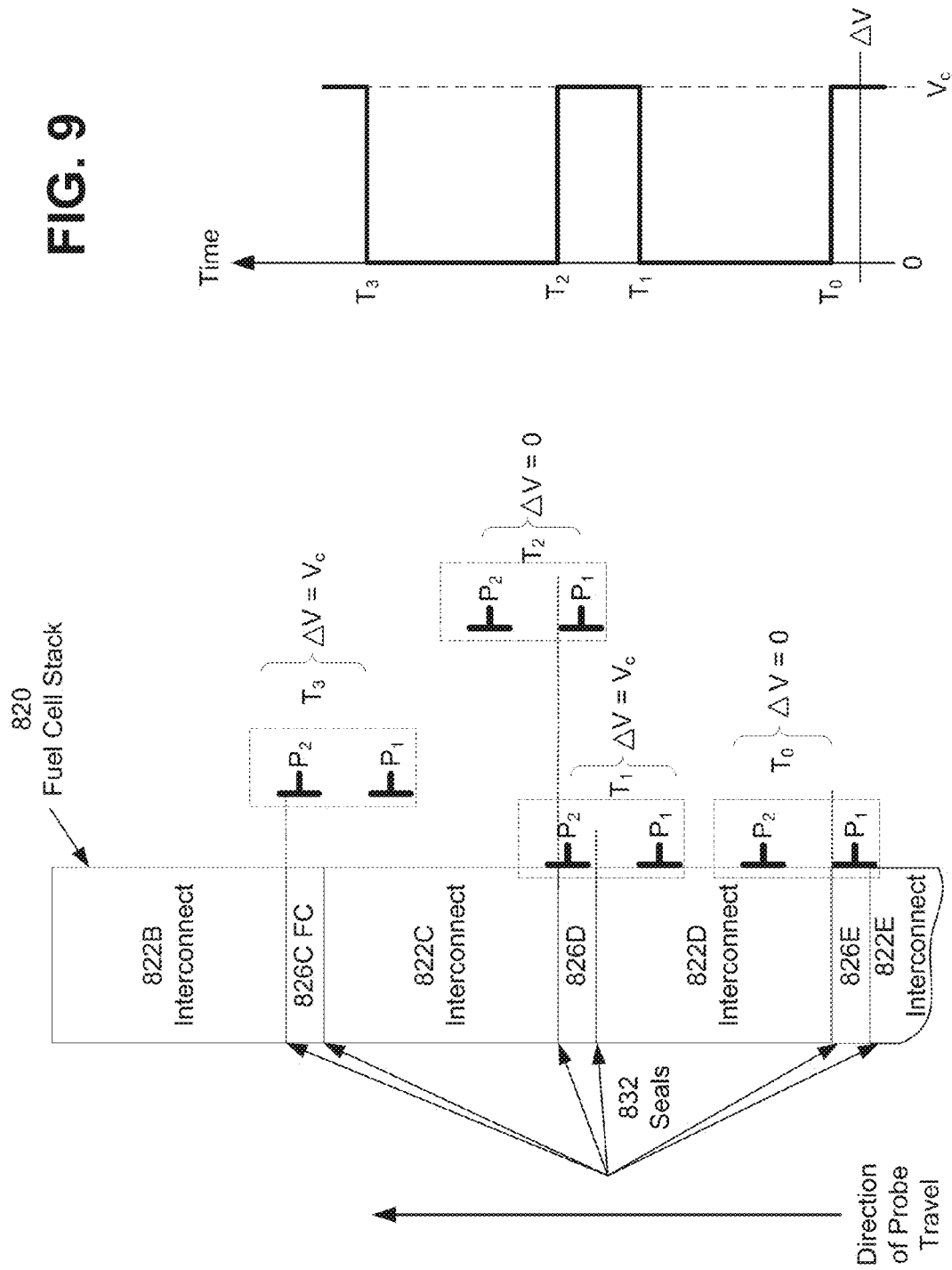
FIG. 9 is a block diagram illustrating a waveform produced by the dimensional array testing assembly using two probes according to an embodiment.
Figure 10:
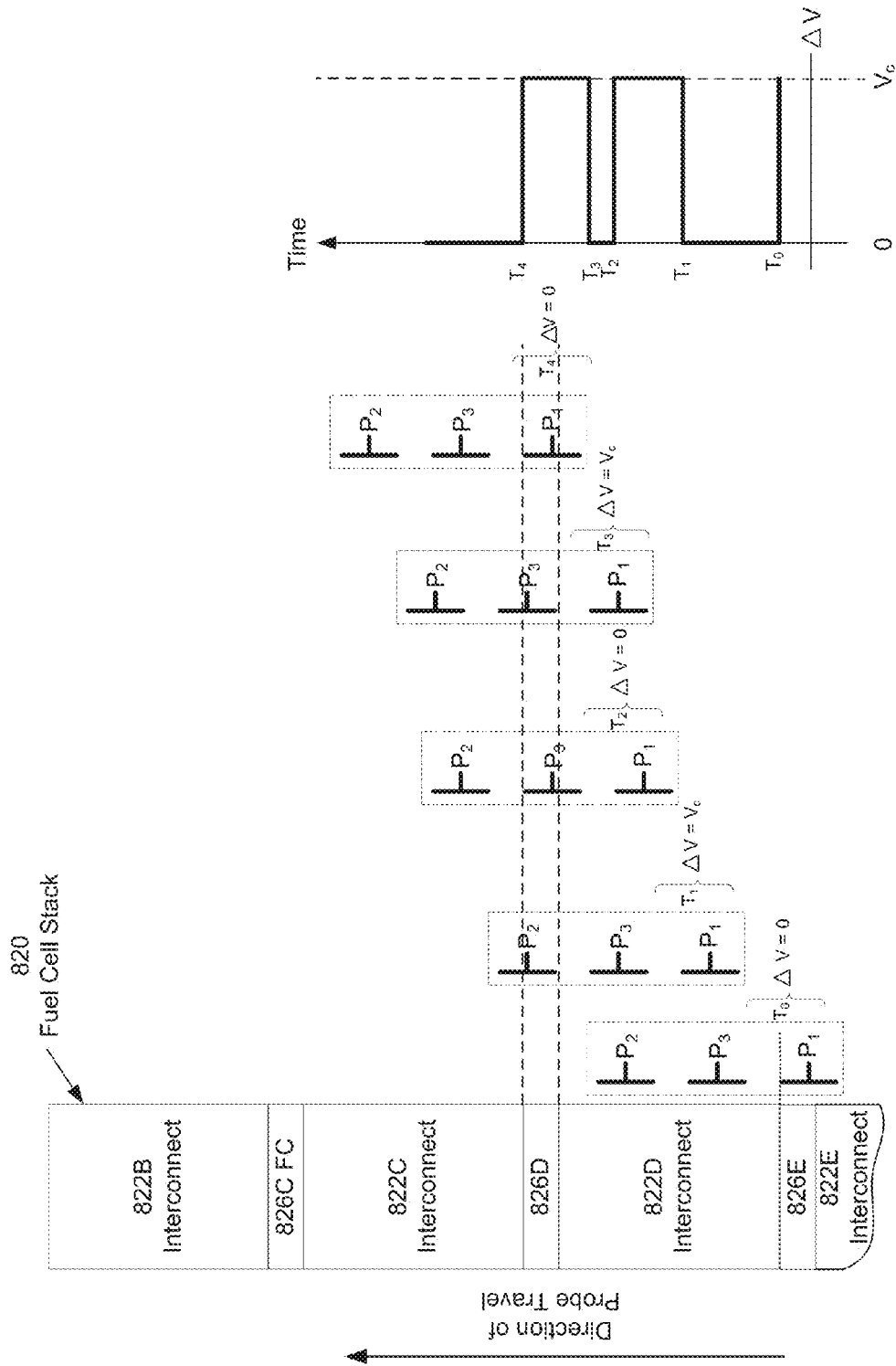
FIG. 10 is a block diagram illustrating a waveform produced by the dimensional array testing assembly using three probes according to an embodiment.

FIG. 8 is a block diagram illustrating a view of a dimensional array testing assembly utilizing at least two probes. FIG. 9 is a block diagram illustrating a waveform produced by the dimensional array testing assembly using two probes. FIG. 10 is a block diagram illustrating a waveform produced by the dimensional array testing assembly using three probes.

Referring to FIG. 8, in an embodiment, a probe assembly 806 supports a probe tip 808A and a probe tip 808B. While only two probe tips are illustrated in FIG. 8, additional probe tips, such as three probe tips, may be utilized. The probe tips 808A and 808B are shown suspended from the carriage 802 via swing arms 810. The swing arms 810 move freely on pivot pins, thereby allowing the probe assembly 806 to swing freely below the carriage 802. Preferably, the probe tips 808A and 808B make contact with the fuel cell stack 820 due to gravitational forces. The fuel cell stack 820 is secured to a base 818. A motor assembly 816 drives a motion control system 804 which moves the carriage 802 and the probe assembly 806 along the fuel cell stack 820.

In an embodiment, the fuel cell stack under test 820 may be an operational fuel cell stack that has been sintered and conditioned. The stack 820 comprises a plurality of fuel cells 826A-F and interconnects 822A-E. Conductive end plates 828, 830 are located at opposite ends of the stack. Seals 832 are located between respective adjacent fuel cells and interconnects. In another embodiment, the fuel cell stack under test may be a unit which has not be sintered and/or preconditioned in which a direct current or voltage is applied to the interconnects to simulate operation. As will be discussed below, the pre- and post conditioning/sintering measurements may be compared to provide insight into the effects of conditioning and sintering on production fuel cell stacks. Additionally, measurements may be taken between sintering and conditioning to determine the contribution of each process to shrinkage.

Referring to FIG. 9, the voltage differential $\Delta V$ between the probe tips $P_1$ and $P_2$ is approximately zero at time $T_0$ (where time is measured relative to the leading edge of probe $P_1$) when both probe tips are in contact with a first interconnect, such as the interconnect 822D or $P_1$ in contact with 826E or seal 832 and $P_2$ in contact with the interconnect 822D. A voltage transition will occur at time T1 when the leading probe tip (probe tip $P_2$) crosses the boundary between the interconnect 822C and the fuel cell 826D and loses contact with the interconnect 822D. In other words, the voltage differential is not zero when the probe tips $P_1$ and $P_2$ contact different interconnects in the same stack.

In the embodiment illustrated in FIG. 9, the width of the probe tips $P_1$ and $P_2$ is sufficiently larger than the height (i.e., thickness) of any one of the fuel cells 826 in the fuel cell stack such that during the crossing interval, the probe tip $P_1$ or $P_2$ will remain in contact with the first interconnect (for example, interconnect 826D) at least until the probe tip contacts the next interconnect in the direction of travel (for example, interconnect 822C). While this "make before break" mode may briefly short circuit the adjacent interconnects, it also suppresses noise that could enter the probe tip if it were otherwise allowed to electrically "float" over the fuel cell stack as it crosses the boundary (i.e., fuel cell 826D and seals 832) between the interconnect 822C and the fuel cell 826D.

When the probe tip $P_2$ makes contact with the second interconnect (such as interconnect 822C) and breaks contact with the first interconnect (such as interconnect 822D), the spacing between the leading probe tip $P_2$ and the trailing probe tip $P_1$ is such that the trailing probe tip $P_1$ will remain in contact with the first interconnect (interconnect 822D) for a time interval equal to $T_2-T_1$. The voltage differential between the probe tips will rise to the voltage of fuel cell 826D (Vc) (beginning at time $T_1$ in FIG. 9). When the leading edge of the trailing probe tip $P_1$ contacts the second interconnect 822C, both probe tips are in contact with the second interconnect 822C (time $T_2$ in FIG. 9) and the voltage differential returns to zero.

The time between voltage transitions from zero, to Vc, to zero may be correlated with the linear speed of the carriage 802 to measure physical dimensions of the fuel cell stack 820. The motion control system (FIG. 8, 804) drives the carriage 802 at a linear speed $S_c$. The voltage transitions reflected in FIG. 9 in conjunction with the known dimensions of the dimensional array testing assembly may be used to accurately compute the distance traveled by probe tips during a particular interval, which distance may be used to compute various dimensional parameters of the fuel cell stack.

For example, the combined height of the fuel cell 826D and the interconnect 822D may be determined by computing $S_c*(T_0-T_2)$ where $S_c$ is the linear speed of the carriage 802, $T_0$ is the time that the trailing probe tip $P_1$ makes contact with the interconnect 822D and $T_2$ is the time that the trailing probe tip $P_1$ makes contact with the interconnect 822C. If the height of interconnect 822D is known, the height of the fuel cell 826D may be determined.

The height of the interconnect 822D may be determined by computing $S_c*(T_0-T_1)$ where $S_c$ is the linear speed of the carriage 802, $T_0$ is the time that the trailing probe tip $P_1$ makes contact with the interconnect 822D and $T_1$ is the time that the trailing probe tip $P_2$ breaks contact with the interconnect 822D. If the separation between top of probe tip $P_1$ and the bottom of probe $P_2$ is known, the height of the interconnect 822D may be determined.

In an embodiment, the fuel cell stack is tested before and after sintering and conditioning. Additionally, measurements may be taken between sintering and conditioning. Testing of the fuel cell stack 820 before sintering and conditioning and/or between sintering and conditioning may be accomplished by connecting each interconnect in the stack 820 to a voltage source and measuring transitions as previously described. Testing of the fuel cell stack 820 after sintering and conditioning may be accomplished by supplying fuel and air to the fuel cell stack 820 and operating the fuel cell stack or by connecting each interconnect in the stack 820 to a voltage source. The "before" measurements may be compared to the "after" measurements to determine the height of the stack before and after sintering and conditioning. The amount of seal shrinkage that occurs during sintering and conditioning may be determined by subtracting the stack height before sintering and conditioning from the stack height after sintering and conditioning. Additionally, measurements may be taken between sintering and conditioning to determine the contribution of each process to shrinkage.

Referring to FIG. 9, a fuel cell stack element pitch is determined by reference to a time interval bounded by succeeding transitions. For example, the fuel cell stack element pitch may be determined by computing $S_c*(T_0-T_2)$, where $S_c$ is the linear speed of the carriage 802, $T_0$ is the time that the trailing probe tip $P_1$ makes contact with the interconnect 822D and $T_2$ is the time that the trailing probe tip $P_1$ makes contact with the interconnect 822C. Alternatively, the fuel cell stack element pitch may determined by reference to the interval defined by $S_c*(T_3-T_1)$ In an embodiment, the fuel cell stack element pitch of each fuel cell stack element is measured and averaged.

FIG. 10 is a block diagram illustrating a waveform produced by the dimensional array testing assembly using three probes. For clarity, the seals 832 illustrated in FIGS. 8 and 9 are not identified in FIG. 10. The additional probe allows for the direct measurement of the fuel cell height. Referring to FIG. 10, the voltage differential $\Delta V$ between the probe tips $P_1$ and $P_2$ is approximately zero at time $T_0$ (where time is measured relative to the leading edge of probe $P_1$) when both probe tips $P_1$ and $P_2$ are in contact with a first interconnect, such as the interconnect 822D.

A voltage transition will occur at time $T_1$ when the leading probe tip $P_2$ crosses the boundary between the interconnect 822C and the fuel cell 826D and loses contact with the interconnect 822D. At time $T_3$, probe $P_3$ contacts with the interconnect 822C while remaining in contact with the interconnect 822D thereby shorting fuel cell 826D. The voltage differential $\Delta V$ between the probe tips $P_1$ and $P_2$ transitions to zero. At time $T_4$, probe $P_3$ loses contact with the interconnect 822C. The voltage differential $\Delta V$ between the probe tips $P_1$ and $P_2$ again transitions to Vc.

Figure 11:
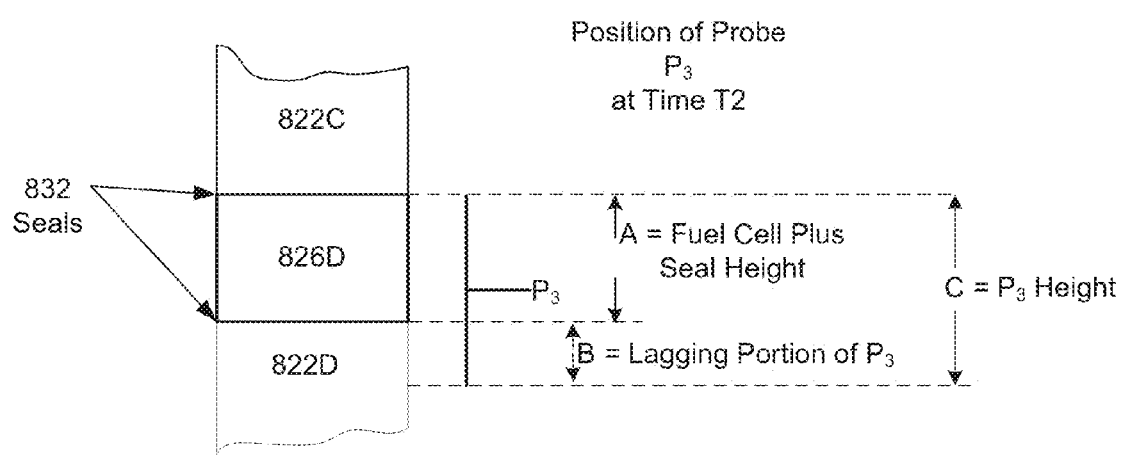
FIG. 11 is a block diagram illustrating a position of a probe tip $P_3$ at time $T_2$ according to an embodiment.

FIG. 11 is a block diagram illustrating the position of the probe tip $P_3$ at time $T_2$. The probe tip $P_3$ is in contact with the lower edge of the interconnect 822C and interconnect 822D. The probe tip $P_3$ creates a short circuit across the two interconnects that continues until the bottom edge of the probe tip $P_3$ clears the top edge of the interconnect 822D. As can be seen from FIG. 11, the height of the probe tip $P_3$ may be expressed as:

C=A+B, where C is the height of the probe tip $P_3$, A is the height of the fuel cell 826D and adjacent seals 832, and B is the portion of the probe tip $P_3$ that is in contact with the interconnect 822D (the "lagging portion") at time $T_2$.

Referring against to FIG. 10, at time $T_3$, the probe tip $P_3$ breaks contact with the interconnect 822D. The time interval measured by $T_3-T_2$ is the time required for the lagging portion B to reach the top of the interconnect 822D. The height of the lagging portion B can be determined by multiplying linear speed $S_c$ of the probe tip $P_3$ times the magnitude of the time interval $T_3-T_2$. The fuel cell height A may then be determined:

A=C−B, where A is the height of the fuel cell, C is the height of the probe tip $P_3$, 826D and B=$S_c*(T_3-T_2)$.

As described above, the combined height of the fuel cell 826D and the interconnect 822D may be determined by computing $S_c*(T_0-T_2)$ where $S_c$ is the linear speed of the carriage 802, $T_0$ is the time that the trailing probe tip $P_1$ makes contact with the interconnect 822D, $T_2$ is the time that the trailing probe tip $P_1$ makes contact with the interconnect 822C. The height of an interconnect, such as the interconnect 822D, may be determined by subtracting the height of the corresponding fuel cell, such as 826D, from the combined height of the interconnect and the fuel cell.

In an embodiment, the fuel cell stack is tested before and after sintering and conditioning and between sintering and conditioning. Testing of the fuel cell stack 820 before sintering and conditioning and between sintering and conditioning may be accomplished by connecting each interconnect in the stack 820 to a voltage source and measuring transitions as previously described. Testing of the fuel cell stack 820 after sintering and conditioning may be accomplished by supplying fuel and air to the fuel cell stack 820 and operating the fuel cell stack or by connecting each interconnect in the stack 820 to a voltage source. The "before" measurements may be compared to the "after" measurements to determine the height of the stack before and after sintering and conditioning. The amount of seal shrinkage that occurs during sintering and conditioning may be determined by subtracting the stack height before sintering and conditioning from the stack height after sintering and conditioning.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Further, words such as "thereafter," "then," "next," etc. are not intended to limit the order of the steps; these words are simply used to guide the reader through the description of the methods.

One or more block/flow diagrams have been used to describe exemplary embodiments. The use of block/flow diagrams is not meant to be limiting with respect to the order of operations performed. The foregoing description of exemplary embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

Control elements such as signal processing equipment 320 shown in FIG. 3 may be implemented using computing devices (such as computers) comprising processors, memory and other components that have been programmed with instructions to perform specific functions or may be implemented in processors designed to perform the specified functions. A processor may be any programmable microprocessor, microcomputer or multiple processor chip or chips that can be configured by software instructions (applications) to perform a variety of functions, including the functions of the various embodiments described herein. In some computing devices, multiple processors may be provided. Typically, software applications may be stored in the internal memory before they are accessed and loaded into the processor. In some computing devices, the processor may include internal memory sufficient to store the application software instructions.

Figure 12:
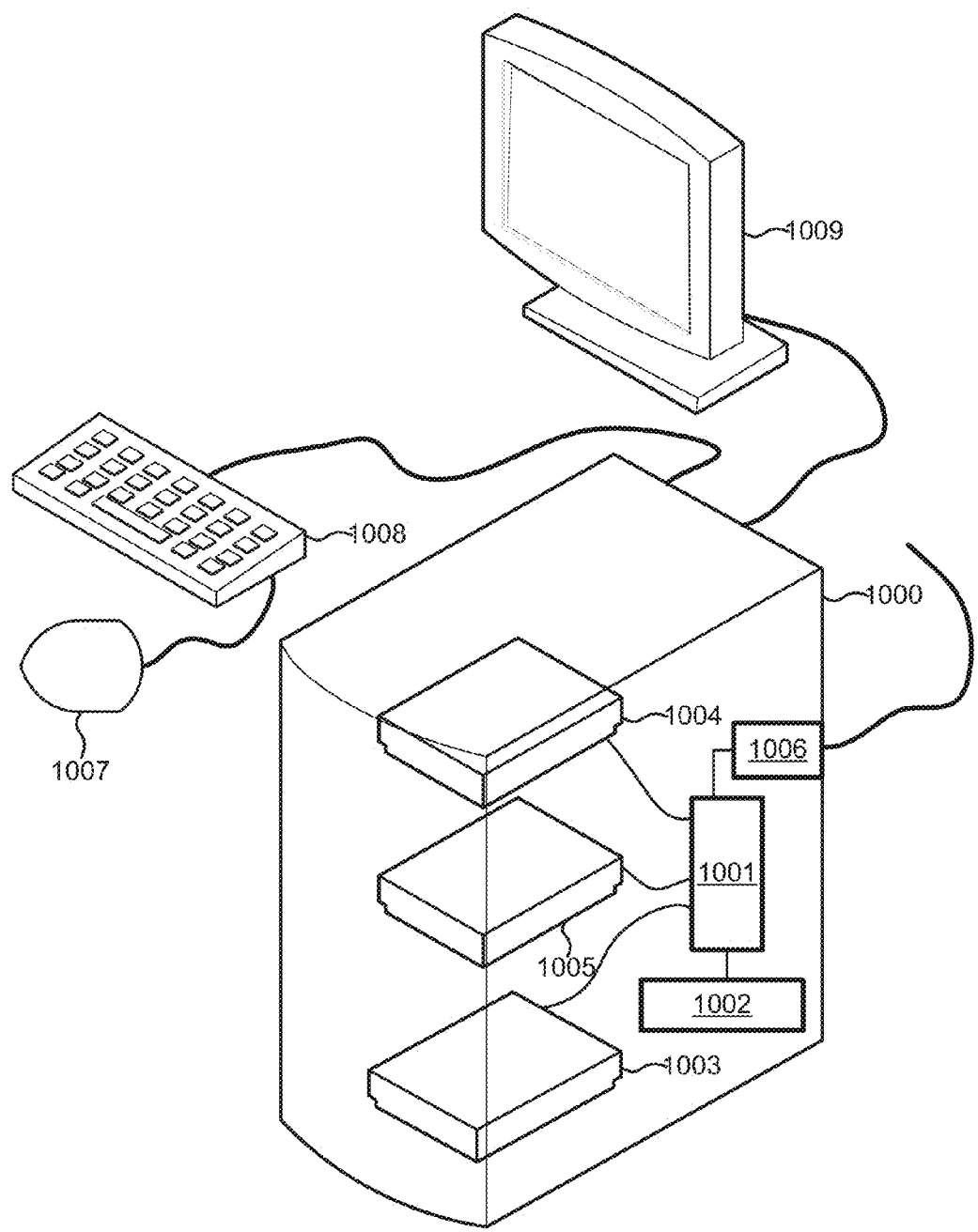
FIG. 12 is a system block diagram of a computing device suitable for use with any of the embodiments.

FIG. 12 is a block diagram of a computing device suitable for use with any of the embodiments Such a computing device 1000 typically includes a processor 1001 coupled to volatile memory 1002 and a large capacity nonvolatile memory, such as a disk or solid state flash drive 1003. Typically, software applications may be stored in the internal memory 1002 before they are accessed and loaded into the processor 1001. The processor 1001 may include internal memory sufficient to store the application software instructions.

The computing device 1000 may also include a flash drive 1004 and a compact disc (CD) drive 1005 coupled to the processor 1001. Typically the computing device 1000 will also include a pointing device such as a mouse 1007, a user input device such as a keyboard 1008 and a display 1009. The computing device 1000 may also include a number of connector ports 1006 coupled to the processor 1001 for establishing data connections or network connections or for receiving external memory devices, such as a USB or FireWire® connector sockets. In a notebook configuration, the computer housing includes the pointing device 1007, keyboard 1008 and the display 1009 as is well known in the computer arts.

While the computing device 1000 is illustrated as using a desktop form factor, the illustrated form is not meant to be limiting. For example, some or all of the components of computing device 1000 may be implemented as a desktop computer, a laptop computer, a mini-computer, a tablet, a smart phone or a personal data assistant.

Figure 13:
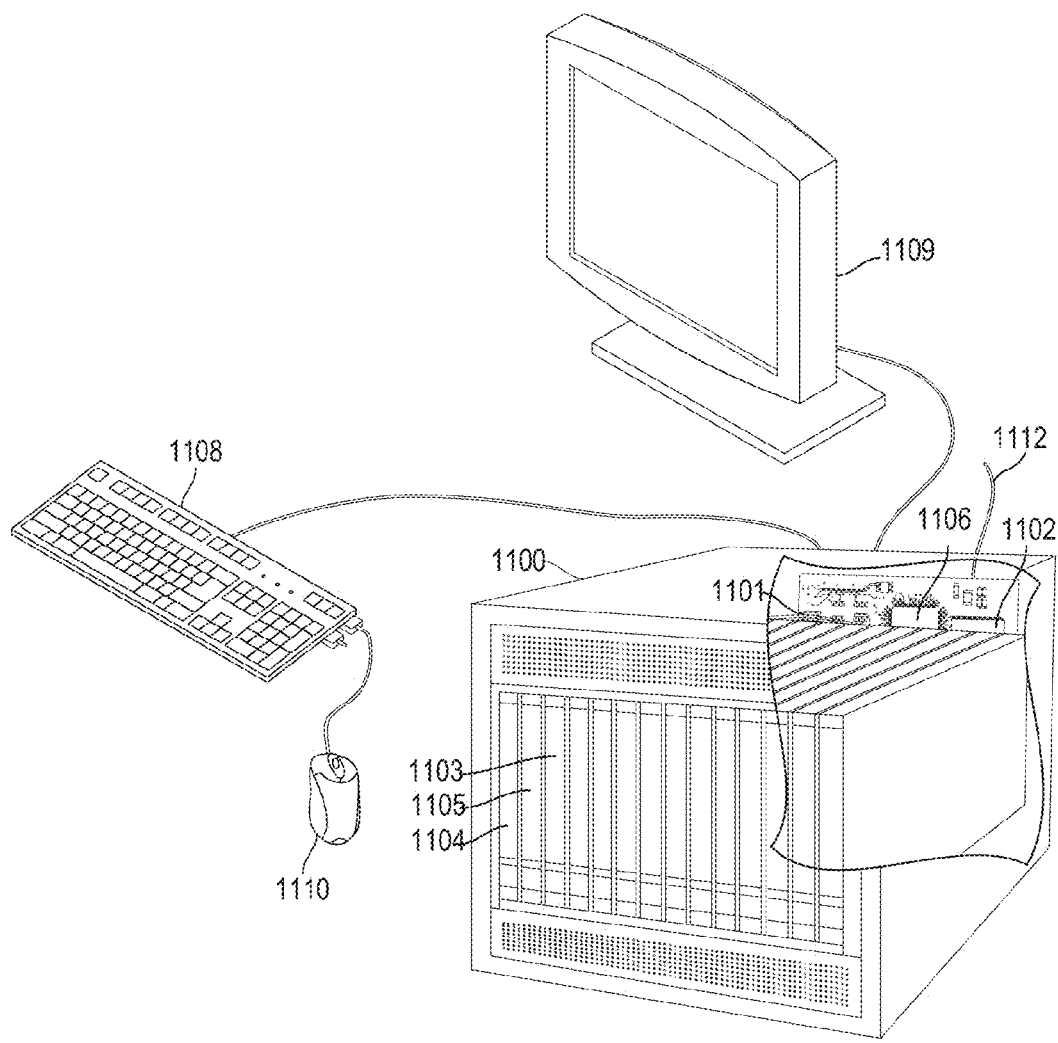
FIG. 13 is a system block diagram of a server device suitable for use with any of the embodiments.

The various embodiments may also be implemented on the on any of a variety of commercially available server devices, such as the server 1100 illustrated in FIG. 13. Such a server 1100 typically includes a processor 1101 coupled to volatile memory 1102 and a large capacity nonvolatile memory, such as a disk drive 1103. The server 1100 may also include a n external drive, compact disc (CD) or DVD disc drive 1104 coupled to the processor 1101. The server 1100 may also include network access ports 1106 coupled to the processor 1101 for establishing data connections with a network 1112, such as a local area network coupled to other broadcast system computers and servers. Servers 1100 may also include operator interfaces, such as a keyboard 1108, pointer device (e.g., a computer mouse 1110), and a display 1109.

The processors 1001 and 1101 may be any programmable microprocessor, microcomputer or multiple processor chip or chips that can be configured by software instructions (applications) to perform a variety of functions, including the functions of the various embodiments described below. In some mobile receiver devices, multiple processors may be provided, such as one processor dedicated to wireless communication functions and one processor dedicated to running other applications. Typically, software applications may be stored in the internal memory 1002, 1102, and or 1103 before they are accessed and loaded into the processors 1001 and 1101. The processor 1001 and 1101 may include internal memory sufficient to store the application software instructions.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

What is claimed is:

1. A method of testing a fuel cell stack, comprising:
   moving at least one voltage probe along the fuel cell stack;
   sequentially measuring a voltage of fuel cell stack elements, the elements comprising fuel cells, interconnects disposed between the fuel cells, and seals disposed between the fuel cells and the interconnects; and
   determining, from the sequentially measured voltage, at least one of a height of the fuel cell stack, a variation of fuel cell height, a fuel cell stack element pitch, and seal shrinkage or setting.

2. The method of claim 1, wherein the determining comprises determining the seal shrinkage or setting before sintering and conditioning the fuel cell stack, after sintering and conditioning the fuel cell stack, or both before and after sintering and conditioning the fuel cell stack.

3. The method of claim 1, wherein the determining comprises determining the shrinkage or setting.

4. The method of claim 1, wherein the determining comprises determining the fuel cell stack element pitch.

5. The method of claim 1, wherein the determining comprises determining the variation of fuel cell height.

6. The method of claim 1, wherein the determining comprises determining the height of the fuel cell stack.

7. The method of claim 1, wherein the sequentially measuring a voltage comprises sequentially measuring a voltage before sintering and conditioning the fuel cell stack.

8. The method of claim 1, wherein the sequentially measuring a voltage comprises sequentially measuring a voltage after at least one of sintering and conditioning the fuel cell stack.

9. The method of claim 1, wherein the sequentially measuring a voltage comprises sequentially measuring a voltage generated by operating the fuel cell stack.

10. The method of claim 1, wherein the sequentially measuring a voltage comprises sequentially measuring a voltage applied to fuel cell stack elements from a voltage source.

11. The method of claim 1, wherein the moving at least one voltage probe along the fuel cell stack comprises moving the at least one voltage probe in contact with the fuel cell stack.

12. The method of claim 1, wherein the fuel cell stack is oriented vertically and wherein moving at least one voltage probe along the fuel cell stack comprises moving at least two vertically offset voltage probes along the fuel cell stack.

13. The method of claim 1, wherein the determining comprises:
   obtaining a speed of the at least one voltage probe moving along the fuel cell stack;
   detecting a time interval of a transition from a first voltage to a second voltage and from the second voltage to the first voltage; and
   determining a distance of travel of the at least one voltage probe along the fuel cell stack from the speed and the time interval.

14. A fuel cell system comprising:
   a fuel cell stack comprising fuel cell stack elements, the elements comprising fuel cells, interconnects disposed between the fuel cells, and seals disposed between the fuel cells and the interconnects;
   a measuring device comprising at least one movable voltage probe that is configured to perform operations comprising:
   moving at least one voltage probe along the fuel cell stack;
   sequentially measuring a voltage of the fuel cell stack elements; and
   determining, from the sequentially measured voltage, at least one of a height of the fuel cell stack, a variation of fuel cell height, a fuel cell stack element pitch, and seal shrinkage or setting.

15. The system of claim 14, wherein the determining comprises determining the seal shrinkage or setting before sintering and conditioning the fuel cell stack, after sintering and conditioning the fuel cell stack, or both before and after sintering and conditioning the fuel cell stack.

16. The system of claim 14, wherein the determining comprises determining the fuel cell stack element pitch.

17. The system of claim 14, wherein the determining comprises determining the variation of fuel cell height.

18. The system of claim 14, wherein the determining comprises determining the height of the fuel cell stack.

19. The system of claim 14, wherein the sequentially measuring a voltage comprises sequentially measuring a voltage applied to the fuel cell stack elements from a voltage source, before sintering and conditioning the fuel cell stack.

20. The system of claim 14, wherein the sequentially measuring a voltage comprises sequentially measuring a voltage generated by operating the fuel cell stack, after at least one of sintering and conditioning the fuel cell stack.

21. The system of claim 14, wherein the moving at least one voltage probe along the fuel cell stack comprises moving the at least one voltage probe in contact with the fuel cell stack.

22. The system of claim 14, wherein the fuel cell stack is oriented vertically and wherein the at least one voltage probe comprises at least two vertically offset voltage probes.

23. A fuel cell system comprising:
   a fuel cell stack comprising fuel cell stack elements;
   a measuring device comprising at least one movable voltage probe that is configured to perform operations comprising:
   moving at least one voltage probe along the fuel cell stack;
   sequentially measuring a voltage of the fuel cell stack elements; and
   determining at least one dimensional value of the fuel cell stack or the fuel cell stack elements from the sequentially measured voltage,
   wherein the measuring device further comprises a processor, wherein the operation of determining the at least one dimensional value of the fuel cell stack or the fuel cell stack elements from the sequential voltage measurements is performed by the processor, and wherein the processor is configured to:
   obtain a speed of the at least one voltage probe moving along the fuel cell stack;
   detect a time interval of a transition from a first voltage to a second voltage and from the second voltage to the first voltage; and
   determine a distance of travel of the at least one voltage probe along the fuel cell stack from the speed and the time interval.

24. A method of testing a fuel cell stack, comprising:
   moving at least one voltage probe along the fuel cell stack;
   sequentially measuring a voltage of fuel cell stack elements, the elements comprising fuel cells, interconnects disposed between the fuel cells, and seals disposed between the fuel cells and the interconnects; and
   determining, from the sequentially measured voltage, at least one of a height of the fuel cell stack, a variation of fuel cell height, a fuel cell stack element pitch, and seal shrinkage or setting,
   wherein the determining comprises:
   obtaining a speed of the at least one voltage probe moving along the fuel cell stack;
   detecting a time interval of a transition from a first voltage to a second voltage and from the second voltage to the first voltage; and
   determining a distance of travel of the at least one voltage probe along the fuel cell stack from the speed and the time interval.

* * * * *